(12) United States Patent
An

(10) Patent No.: US 11,600,335 B2
(45) Date of Patent: Mar. 7, 2023

(54) MEMORY DEVICE AND BIT LINE PRECHARGING METHOD DURING PROGRAM VERIFY OPERATION IN THE MEMORY DEVICE

(71) Applicant: SK hynix Inc., Gyeonggi-do (KR)

(72) Inventor: Chi Wook An, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/827,109

(22) Filed: Mar. 23, 2020

(65) Prior Publication Data

US 2021/0065812 A1 Mar. 4, 2021

(30) Foreign Application Priority Data

Aug. 26, 2019 (KR) .................. 10-2019-0104713

(51) Int. Cl.
| | | |
|---|---|---|
| G11C 16/24 | (2006.01) | |
| G11C 16/04 | (2006.01) | |
| G11C 16/10 | (2006.01) | |
| G11C 16/26 | (2006.01) | |
| G11C 16/34 | (2006.01) | |

(52) U.S. Cl.
CPC .......... *G11C 16/24* (2013.01); *G11C 16/0483* (2013.01); *G11C 16/10* (2013.01); *G11C 16/26* (2013.01); *G11C 16/3459* (2013.01)

(58) Field of Classification Search
None
See application file for complete search history.

(56) References Cited

U.S. PATENT DOCUMENTS

| | | | | |
|---|---|---|---|---|
| 5,903,495 | A   * | 5/1999  | Takeuchi ............ | G11C 11/5642 365/185.03 |
| 2001/0015909 | A1* | 8/2001  | Sato ..................... | G11C 11/5621 365/185.03 |
| 2007/0097749 | A1* | 5/2007  | Li ........................ | G11C 16/3459 365/185.22 |
| 2008/0159005 | A1* | 7/2008  | Lee ....................... | G11C 16/26 365/185.25 |
| 2010/0182841 | A1* | 7/2010  | Lee ....................... | G11C 16/26 365/185.21 |
| 2011/0273935 | A1* | 11/2011 | Dong .................. | G11C 11/5642 365/185.25 |
| 2013/0336071 | A1* | 12/2013 | Kwon ................... | G11C 16/10 365/185.22 |
| 2015/0052294 | A1* | 2/2015  | Cho ...................... | G11C 16/26 711/103 |
| 2017/0271023 | A1* | 9/2017  | Maejima ............ | G11C 16/3436 |

FOREIGN PATENT DOCUMENTS

| | | |
|---|---|---|
| KR | 10-2011-0131648 | 12/2011 |
| KR | 10-2013-0007932 | 1/2013 |
| KR | 10-2015-0139116 | 12/2015 |
| KR | 10-1925018 | 12/2018 |

* cited by examiner

*Primary Examiner* — J. H. Hur
(74) *Attorney, Agent, or Firm* — IP & T Group LLP

(57) ABSTRACT

A memory device includes bit lines coupled to a memory block, a page buffer group selecting the bit lines in response to page buffer signals, applying a precharge voltage to selected bit lines from among the bit lines, and applying a ground voltage to unselected bit lines during a program verify operation, and a page buffer controller outputting the page buffer signals to selectively apply the precharge voltage to the bit lines according to an order of read operations on a logical page during the program verify operation.

6 Claims, 10 Drawing Sheets

MEMORY DEVICE AND BIT LINE PRECHARGING METHOD DURING PROGRAM VERIFY OPERATION IN THE MEMORY DEVICE

CROSS-REFERENCE TO RELATED APPLICATION

The present application claims priority under 35 U.S.C. § 119(a) to Korean patent application number 10-2019-0104713 filed on Aug. 26, 2019, the entire disclosure of which is incorporated herein by reference in its entirety.

BACKGROUND

1. Technical Field

Various embodiments relate generally to a memory device and an operating method thereof, and more particularly, to a memory device capable of performing program and read operations, and an operating method thereof.

2. Related Art

A memory device may store data or output the stored data. For example, the memory device may include a volatile memory device which loses stored data when its power supply is interrupted, or a non-volatile memory device which retains the stored data even when its power supply is interrupted. The memory device may include a memory cell array storing data, peripheral circuits performing various operations including program, read, and erase operations, and a control logic controlling the peripheral circuits.

The memory controller may control data communication between a host and the memory device.

The memory device may communicate with the memory controller through a channel and perform a program, read, or erase operation in response to a command received from the memory controller.

Memory devices may be classified into volatile memory devices and non-volatile memory devices. Volatile memory devices may lose data when their power supply is stopped, whereas non-volatile memory devices can retain stored data even in the absence of a power supply. Non-volatile memory devices and volatile memory devices have advantages and disadvantages. Thus, an appropriate choice may be made for its purpose.

For a non-volatile memory device, a program or read operation may be performed in units of pages each corresponding to a group of memory cells coupled to a single word line. Therefore, in order to simultaneously operate a plurality of memory cells included in a single page during a read operation, a large amount of voltage or current may be required instantaneously.

However, when a program operation environment and a read operation environment are different from each other, i.e., when noise which is not generated during a program operation is generated during a read operation, the reliability of the read operation may be reduced.

SUMMARY

Various embodiments of the present disclosure are directed to a memory device capable of compensating for, in a program operation, noise which may occur during a read operation by selectively precharging bit lines during a program verify operation in consideration of an order for a read operation, and a method of operating the same.

According to an embodiment, a memory device may include bit lines coupled to a memory block, a page buffer group selecting the bit lines from among the bit lines in response to page buffer signals, applying a precharge voltage to selected bit lines, and applying a ground voltage to unselected bit lines during a program verify operation, and a page buffer controller outputting the page buffer signals for the page buffer group to selectively apply the precharge voltage to the selected bit lines according to an order of read operations on a logical page during the program verify operation.

According to an embodiment, a method of operating a memory device may include performing a read operation on memory cells of a logical page by applying a ground voltage to bit lines of selected columns with data determined based on a read voltage, and applying a precharge voltage to bit lines of remaining columns, applying the ground voltage to one or more of the bit lines and applying the precharge voltage to remaining bit lines according to a verify voltage corresponding to the read voltage, during a program verify operation on selected memory cells, and applying the verify voltage to a word line coupled to the selected memory cells and verifying the memory cells, when the ground voltage or the precharge voltage is selectively applied to the bit lines.

According to an embodiment, a method of operating a memory device may include applying a precharge voltage being a positive voltage to all bit lines during a first read operation of a selected logical page from among a plurality of logical pages included in a selected physical page, and applying a ground voltage to bit lines of a memory cell with data determined by a previous read operation and applying the precharge voltage to remaining bit lines during second and subsequent read operations of the selected logical page, and selectively applying the ground voltage and the precharge voltage to the bit lines in a same manner as the read operations according to verify voltages respectively corresponding to read voltages of the read operations during a program verify operation when the selected physical page is programmed with logical data corresponding to the plurality of logical pages.

According to an embodiment, a method of operating a memory device may include performing a read operation with two or more read bias groups on the page by applying a ground voltage to a bit line of a memory cell, a status of which is determined by a previous read bias group, and applying a precharge voltage to a bit line of a memory cell, a status of which is to be determined by one or more subsequent read bias groups, and performing, after a program voltage is applied to the page, a program verify operation with two or more verify bias groups on the page by applying the ground voltage to the bit line of the memory cell, the status of which is determined by a previous verify bias group, and applying the precharge voltage to the bit line of the memory cell, the status of which is to be determined by one or more subsequent verify bias groups, wherein the read bias groups respectively correspond to the verify bias groups.

DETAILED DESCRIPTION

Specific structural or functional descriptions of examples of embodiments in accordance with concepts which are disclosed in this specification are illustrated only to describe the examples of embodiments in accordance with the concepts. The examples of embodiments in accordance with the concepts may be carried out by various forms but the descriptions are not limited to the examples of embodiments described in this specification.

Figure 1:
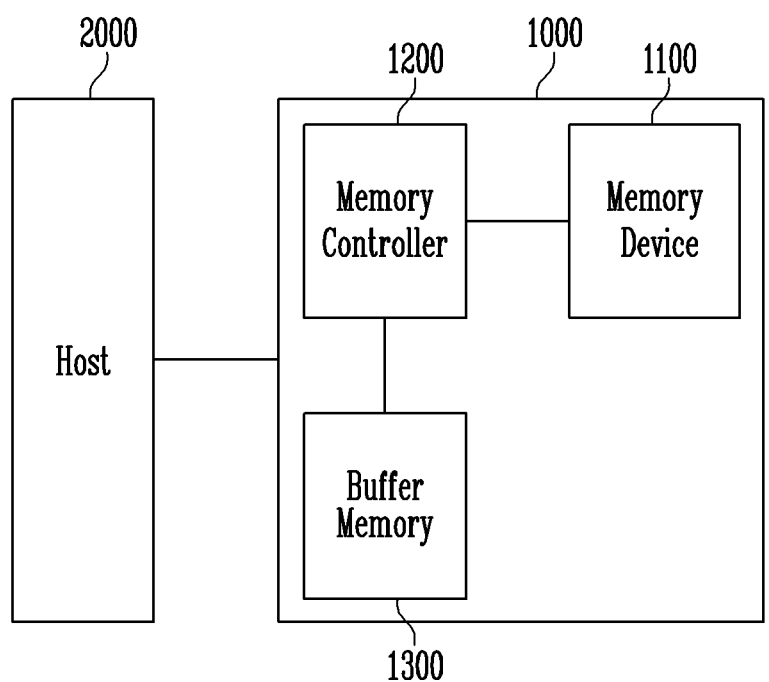
FIG. 1 is a diagram illustrating a memory system.

FIG. 1 is a diagram illustrating a memory system 1000.

Referring to FIG. 1, the memory system 1000 may include a memory device 1100 storing data, a buffer memory 1300 temporarily storing data necessary for operations of a memory system 1000, and a memory controller 1200 controlling the memory device 1100 and the buffer memory 1300 in response to control of a host 2000.

The host 2000 may communicate with the memory system 1000 using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Non-volatile Memory express (NVMe), Universal Flash Storage (UFS), Secure Digital (SD), Multi-Media Card (MMC), embedded MMC (eMMC), Dual In-line Memory Module (DIMM), Registered DIMM (RDIMM), and Load Reduced DIMM (LRDIMM) communication methods.

The memory devices 1100 may include a volatile memory device which loses the stored data when a power supply is interrupted, or a non-volatile memory device which retains the stored data even when the power supply is interrupted. The memory controller 1200 may control the memory device 1100 to perform a program, read, or erase operation. For example, during a program operation, the memory device 1100 may receive a command, an address, and data from the memory controller 1200 and perform the program operation. According to an embodiment of the present disclosure, the memory device 1100 may reflect noise occurring during a read operation when performing a program operation, so that read errors caused by the noise generated during the read operation may be prevented. For example, the memory device 1100 may reflect a noise value corresponding to noise that may occur during a read operation in an operation of precharging bit lines during a program verify operation.

The memory controller 1200 may control the general operations of the memory system 1000 and control data exchange between the host 2000 and the memory device 1100. For example, the memory controller 1200 may control the memory device 1100 to program, read or erase data in response to a request from the host 2000. In addition, the memory controller 1200 may receive data and a logical address from the host 2000 and convert the logical address into a physical address indicating a region where the data is actually stored. In addition, the memory controller 1200 may generate a logical-to-physical address mapping table configuring a mapping relationship between a logical address and a physical address, and may store the mapping table in the buffer memory 1300.

The buffer memory 1300 may serve as an operation memory or a cache memory of the memory controller 1200 and store various types of system data used in the memory system 1000 in addition to the above mapping table. FIG. 1 illustrates that the buffer memory 1300 is located outside the memory controller 1200. However, depending on the memory system 1000, the buffer memory 1300 may be located in the memory controller 1200. According to an embodiment, the buffer memory 1300 may include Double Data Rate Synchronous Dynamic Random Access Memory (DDR SDRAM), DDR4 SDRAM, Low Power Double Data Rate 4 (LPDDR4) SDRAM, Graphics Double Data Rate (GDDR) SDRAM, Low Power DDR (LPDDR), or Rambus Dynamic Random Access Memory (RDRAM).

Figure 2:
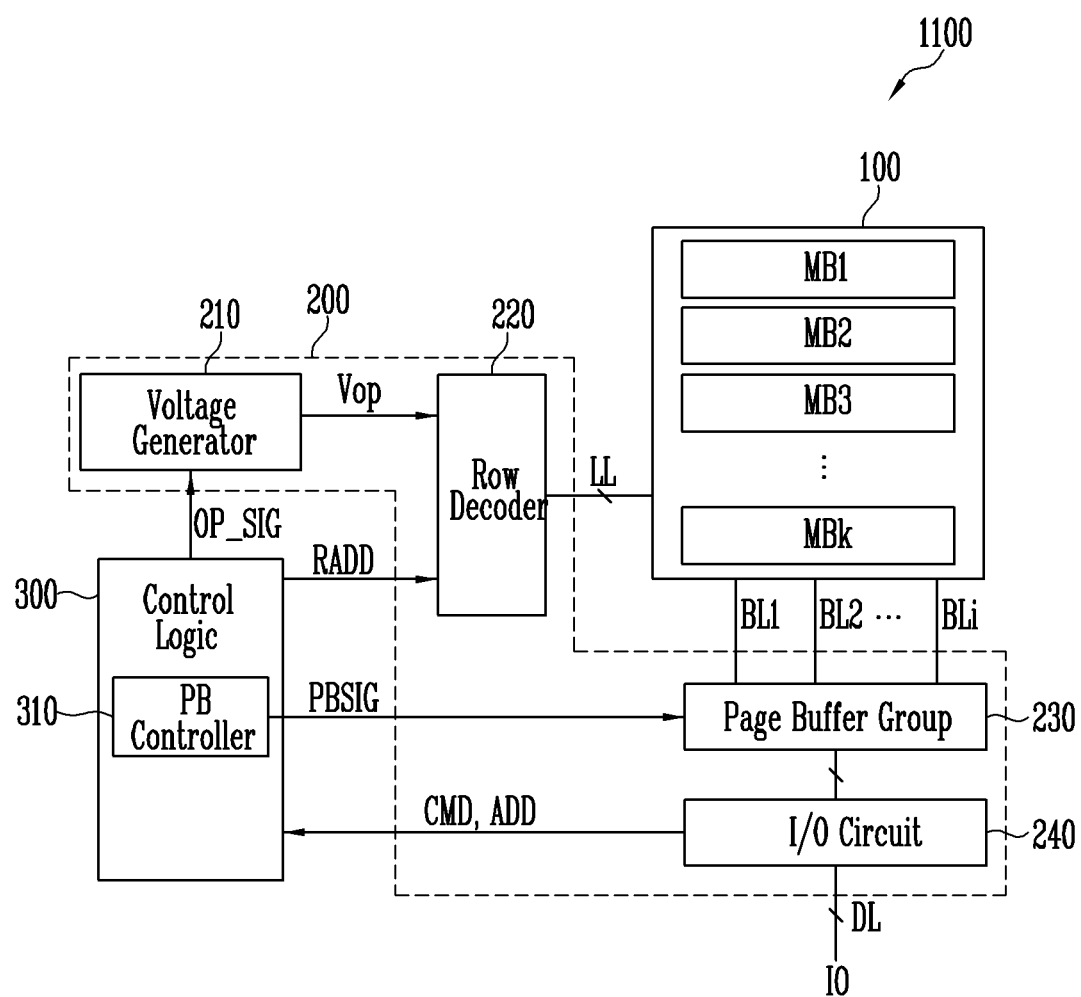
FIG. 2 is a diagram illustrating a memory device according to an embodiment of the present disclosure.

FIG. 2 is a diagram illustrating the memory device 1100 according to an embodiment of the present disclosure.

Referring to FIG. 2, the memory device 1100 may include a memory cell array 100 storing data, peripheral circuits 200 performing program, read and erase operations, and a control logic 300 controlling the peripheral circuits 200.

The memory cell array 100 may include a plurality of memory blocks MB1 to MBk, where k is a positive integer. Each of the memory blocks MB1 to MBk may include a plurality of memory cells and have the same configuration. The memory blocks MB1 to MBk may share a source line SL with bit lines BL1 to BLi, where i is a positive integer, and may be coupled to local lines LL, respectively. The memory blocks MB1 to MBk may include a plurality of memory cells having a two-dimensional or three-dimensional structure. The two-dimensional memory cells may be arranged in a horizontal direction to a substrate. The three-dimensional memory cells may be stacked in a vertical direction to the substrate.

The peripheral circuits 200 may include a voltage generator 210, a row decoder 220, a page buffer group 230, an I/O circuit 240, and a control logic 300.

The voltage generator 210 may generate operating voltages Vop in response to an operating signal OP_SIG and output the generated operating voltages Vop. The operating voltages Vop may include a program voltage, a pass voltage, a read voltage, an erase voltage and a verify voltage. During a program operation, the voltage generator 210 may generate and output a program voltage, a verify voltage and a pass voltage. During a read operation, the voltage generator 210 may generate and output a read voltage and a pass voltage. During an erase operation, the voltage generator 210 may generate and output an erase voltage, an erase verify voltage and a pass voltage.

The row decoder 220 may transfer the operating voltages Vop to a selected memory block according to a row address RADD. For example, the row decoder 220 may transfer the operating voltages Vop through the local lines LL coupled to the selected memory block in response to the row address RADD. For example, during a program operation, the row decoder 220 may transfer a program voltage or a verify voltage to a selected word line, among the local lines LL, and a pass voltage to unselected word lines. During the program operation, the pass voltage may be set to have a higher voltage level than the verify voltage. During a read operation, the row decoder 220 may transfer a read voltage to a selected word line, among the local lines LL, and a pass voltage to unselected word lines. During the read operation, the pass voltage may be set to have a higher voltage level than the read voltage. Each of the program voltage, the verify voltage, the read voltage, the pass voltage and the erase voltage may be set to a positive voltage. A verify voltage used in the erase operation may be set to a negative voltage.

The page buffer group 230 may be coupled to the selected memory block through the bit lines BL1 to BLi. The page buffer group 230 may include a plurality of buffers coupled to the bit lines BL1 to BLi, and each of the page buffers may temporarily store data during a program or read operation. For example, the page buffers included in the page buffer group 230 may simultaneously operate in response to page buffer signals PBSIG. During a program operation, the page buffer group 230 may temporarily store the data received from the I/O circuit 240, and may control the voltage or current in the bit lines BL1 to BLi in response to the received data. During a program verify operation or an erase verify operation, the page buffer group 230 may temporarily store the data sensed by the voltage or the current of the bit lines BL1 to BLi. During a read operation, the page buffer group 230 may transfer the data read through the bit lines BL1 to BLi to the I/O circuit 240.

Each of the page buffers included in the page buffer group 230 may include a plurality of latches for temporarily storing data and generate a precharge voltage for precharging the bit lines BL1 to BLi by combining data stored in the latches in response to the page buffer signals PBSIG. For example, page buffers PB1 to PBi may selectively precharge the bit lines BL1 to BLi by transferring data between the latches by various methods in response to the page buffer signals PBSIG. For example, during a program verify operation, the page buffer group 230 may selectively apply a ground voltage (0 V) or a precharge voltage to the bit lines BL1 to BLi in response to the page buffer signals PBSIG. The precharge voltage may be set to a positive voltage greater than the ground voltage (0 V).

The I/O circuit 240 may be coupled to the memory controller 1200 of FIG. 1 through input/output lines 10, receive a command CMD, an address ADD and data from the memory controller 1200, and may output the data received from the page buffer group 230 to the memory controller 1200. For example, during a program operation, when receiving the command CMD, the address ADD and the data, the I/O circuit 240 may transfer the received command CMD and address ADD to the control logic 300 and transfer the received data to a column decoder.

The control logic 300 may output operating signals OP_SIG, the row address RADD and the page control signals PBSIG in response to the command CMD and the address ADD. The control logic 300 may include a page buffer controller 310 for controlling the page buffer group 230.

The page buffer controller 310 may output the page buffer signals PBSIG for controlling the page buffer group 230 during a program operation, a read operation, or an erase operation. For example, during a program verify operation, the page buffer controller 310 may output the page buffer signals PBSIG so that the precharge voltage may be applied to only selected bit lines according to an algorithm that is set based on the order of the read operation.

Figure 3:
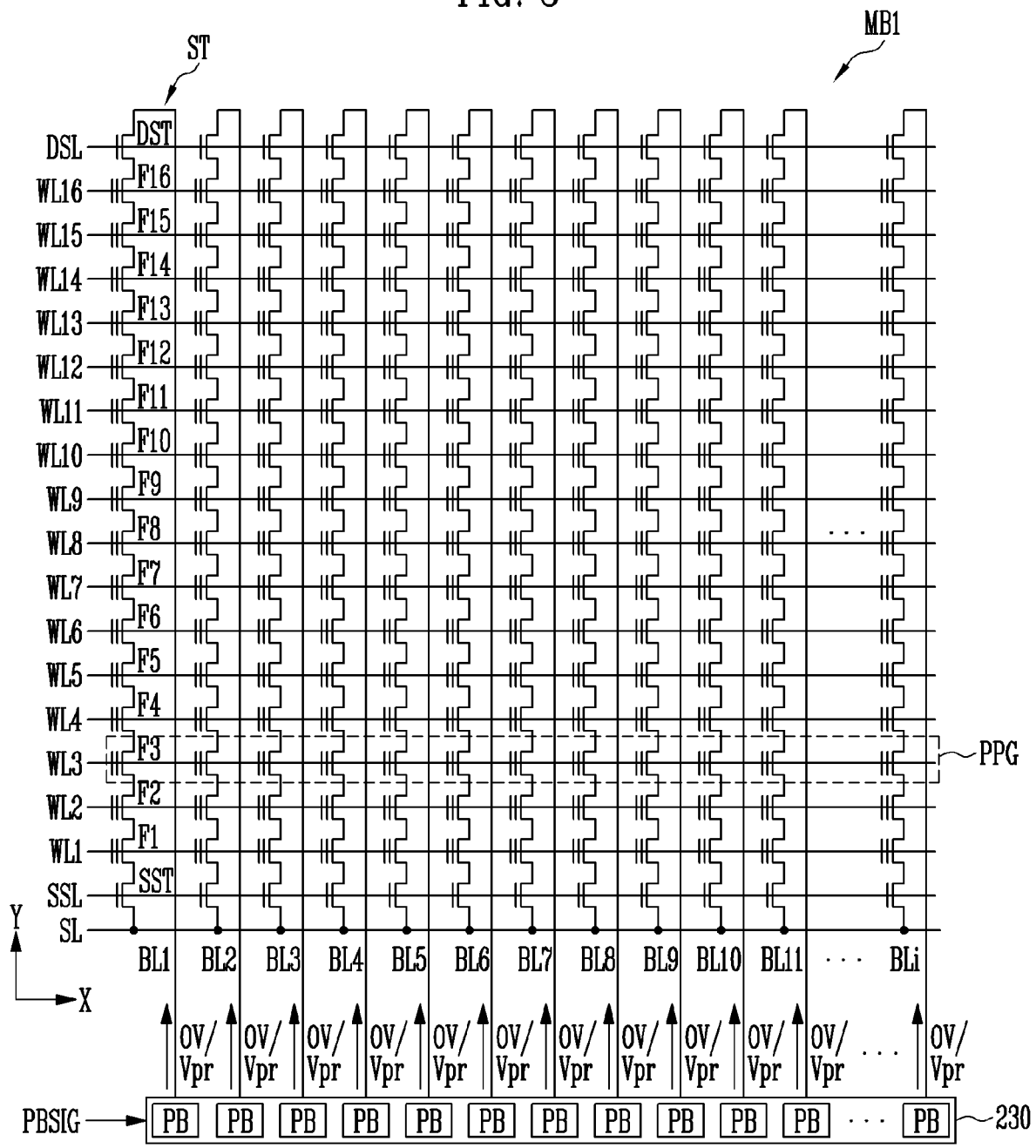
FIG. 3 is a diagram illustrating a memory block shown in FIG. 2.

FIG. 3 is a diagram illustrating one of the memory blocks MB1 to MBk shown in FIG. 2.

Referring to FIG. 3, since the memory blocks MB1 to MBk may have the same configuration, the first memory block MB1 will be described as an example.

The first memory block MB1 may include a plurality of word lines WL1 to WL16 arranged in parallel with each other between a first select line and a second select line. However, the number of word lines WL1 to WL16 may not be limited to the number of word lines shown in FIG. 3. The first select line may be a source select line SSL and the second select line may be a drain select line DSL. More specifically, the first memory block MB1 may include a plurality of strings ST coupled between the bit lines BL1 to BLi and a source line SL. The bit lines BL1 to BLi may be coupled to the strings ST, respectively, and the source line SL may be coupled in common to the strings ST. Since the strings ST may have the same configuration, the string ST coupled to the first bit line BL1 will be described in detail by way of example.

The string ST may include a source select transistor SST, a plurality of memory cells F1 to F16, and a drain select transistor DST coupled in series between the source line SL and the first bit line BL1. Each string ST may include at least one source select transistor SST, at least one drain select transistor DST, and more memory cells than the memory cells F1 to F16 as shown in FIG. 3.

A source of the source select transistor SST may be coupled to the source line SL and a drain of the drain select transistor DST may be coupled to the first bit line BL1. The memory cells F1 to F16 may be coupled in series between the source select transistor SST and the drain select transistor DST. Gates of the source select transistors SST included in different strings ST may be coupled in common to the source select line SSL, gates of the drain select transistors DST may be coupled in common to the drain select line DSL, and gates of the memory cells F1 to F16 may be coupled to the plurality of word lines WL1 to WL16, respectively. A group of memory cells coupled to the same word line, among memory cells included in different strings ST, may be referred to as a physical page PPG. Therefore, the first memory block MB1 may include as many physical pages PPG as the number of word lines WL1 to WL16.

A method of storing one bit of data in a single memory cell is referred to as a single level cell (SLC) method. One physical page PPG may store logical data corresponding to one logical page LPG. A method of storing two bits of data in a single memory cell is referred to as a multi-level cell (MLC) method. One physical page PPG stores logical data corresponding to two logical pages LPG. In addition, a method of storing three bits of data in a single memory cell may be referred to as a triple level cell (TLC) method. A method of storing four bits of data in a single memory cell is referred to as a quadruple level cell (QLC) method. However, more than four bits of data may be stored in a single memory cell. The present embodiment is applicable to the MLC method, the TLC method, the QLC method and other methods which store more bits of data.

A plurality of memory cells included in one physical page PPG may be programmed or read at the same time. In other words, the memory device 1100 may perform a program operation and a read operation in units of the physical pages PPG. A plurality of memory cells included in a single memory block may be simultaneously erased. In other words, the memory device 1100 may perform an erase operation in units of memory blocks.

The bit lines BL1 to BLi coupled to the strings ST, respectively, may be coupled to the page buffers PB included in the page buffer group 230. For example, during a program verify operation, the page buffers PB may selectively apply a ground voltage (0 V) or a precharge voltage Vpr to the bit lines BL1 to BLi in response to the page buffer signals PBSIG.

Figure 4:
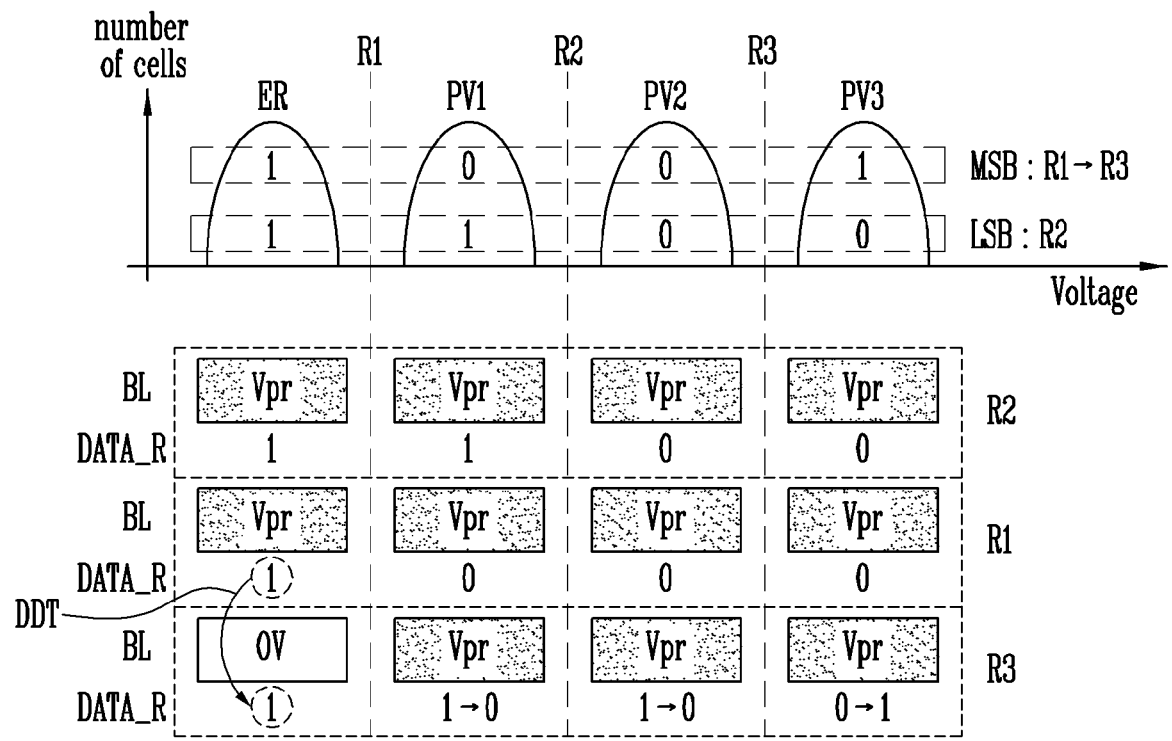
FIG. 4 is a diagram illustrating a read operation.

FIG. 4 is a diagram illustrating a read operation.

Referring to FIG. 4, in an MLC method, memory cells may have any one of an erase state (ER) and three program states (PV1 to PV3). For example, a first program state PV1 may have a greater threshold voltage than an erase state ER, a second program state PV2 may have a greater threshold voltage than the first program state PV1, and a third program state PV3 may have a greater threshold voltage than the second program state PV2.

Thus, three read voltages (R1 to R3) may be used in a read operation of the memory cells programmed using the MLC method. For example, a first read voltage R1 for discriminating the erase state ER from the first to third program states PV1 to PV3, a second read voltage R2 for discriminating the erase state ER and the first program state PV1 from the second and third program states PV2 and PV3, and a third read voltage R3 for discriminating the erase state ER and the first and second program states PV1 and PV2 from the third program state PV3, may be used.

In the MLC method, a memory cell may store logical data including least significant bit (LSB) data and most significant bit (MSB) data. Therefore, the first to third read voltages R1 to R3 may be set to discriminate the LSB data from the MSB data. For example, the second read voltage R2 may be used to identify the LSB data, and the first and third read voltages R1 and R3 may be used to identify the MSB data.

During a read operation using the second read voltage R2, since memory cells having threshold voltages lower or higher than the second read voltage R2 are unknown, the read operation may be performed with the precharge voltage Vpr applied to all bit lines.

When the read operation using the second read voltage R2 is performed, memory cells having threshold voltages less than the second read voltage R2 may become ON cells, whereas memory cells having threshold voltages greater than the second read voltage R2 may become OFF cells. An ON cell may refer to a cell in which a channel is formed and a current flows. An OFF cell may refer to a cell in which a channel is blocked and a current does not flow. In this embodiment, read data DATA_R of an ON cell may be defined as 1 (one) and read data DATA_R of an OFF cell may be defined as 0 (zero). Therefore, by performing the read operation using the second read voltage R2, the read data DATA_R of the memory cells having the erase state ER and the first program state PV1 may be 1, and the read data DATA_R of the memory cells having the second and third program states PV2 and PV3 may be 0. In the MLC method, since the LSB data is identified by the second read voltage R2, the operation of identifying the LSB data may be terminated by only the read operation using the second read voltage R2.

To identify the MSB data, read operations using the first and third read voltages R1 and R3 may be performed. The order in which the read operation using the first read voltage R1 and the read operation using the third read voltage R3 are performed may vary depending on a type of a memory device. According to this embodiment, the read operation using the first read voltage R1 may be performed prior to the read operation using the third read voltage R3.

Since the read operation using the first read voltage R1 is the first read operation for identifying MSB data, this read operation may be performed without determined data DDT. Therefore, the read operation using the first read voltage R1 may be performed with the precharge voltage Vpr applied to all bit lines.

When the read operation using the first read voltage R1 is performed, memory cells having lower threshold voltages than the first read voltage R1 may become ON cells. As a result, the read data DATA_R may be 1. In addition, since memory cells having greater threshold voltages than the first read voltage R1 become OFF cells, the read data DATA_R may be 0.

The first read voltage R1 may have the lowest voltage level among the read voltages for identifying the MSB data. Thus, the MSB data of the memory cells having the erase state ER may be determined as 1. In other words, although the read data DATA_R of the memory cells having the first to third program states PV1 to PV3 are 0, since the read operation using the third read voltage R3 is not performed yet, the MSB data of the first to third program states PV1 to PV3 may not be determined data. Therefore, only '1' data of the memory cells corresponding to the erase state ER may be the determined data DDT in the read operation using the first read voltage R1.

As described above, the memory cells corresponding to the determined data DDT may not have to be read again during a read operation using the next read voltage in read operations of the same logical page (e.g., MSB page). Thus, these memory cells may be excluded from a read target in the read operation using the next read voltage.

When the read operation using the third read voltage R3 starts, a ground voltage of 0 V may be applied to bit lines of the memory cells corresponding to the determined data DDT during the previous read operation, i.e., the read operation using the first read voltage R1, and the precharge voltage Vpr may be applied to bit lines coupled to memory cells with no determined data DDT.

When the read operation using the third read voltage R3 is performed, memory cells having threshold voltages less than the third read voltage R3 and corresponding to the first and second program states PV1 and PV2 may become ON cells, and memory cells having threshold voltages greater than the third read voltage R3 and corresponding to the third program state PV3 may become OFF cells. Therefore, the read data DATA_R of the memory cells having the first and second program states PV1 and PV2 may be 1, and the read data DATA_R of the memory cells having the third program state PV3 may be 0. According to an algorithm of a read operation, the read data DATA_R of the read operation using the third read voltage R3 may be inverted and stored. Therefore, the read data DATA_R of the memory cells corresponding to the first and second program states PV1 and PV2 may change from 1 to 0, and the read data DATA_R of the memory cells corresponding to the third program state PV3 may change 0 to 1. Since the read data DATA_R of the memory cells in the erase state ER is previously determined during the read operation using the first read voltage R1, the read data DATA_R may be maintained at 1. Accordingly, when the read operation using the third read voltage R3 finishes, the LSB and MSB data of the first program state PV1, the second program state PV2 and the third program state PV3 may be 11, 10, 00 and 01, respectively.

In this embodiment, in a program verify operation, bit lines may be selectively precharged in the same manner as a read operation, so that noise caused by the differences between the read operation and a program operation may be compensated. This will be described below in more detail.

Figure 5:
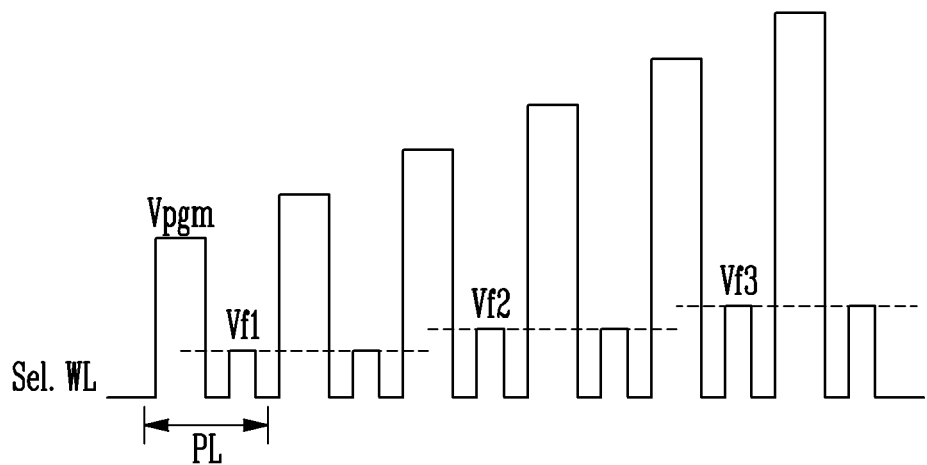
FIG. 5 is a diagram illustrating a program operation.

FIG. 5 is a diagram illustrating a program operation.

Referring to FIG. 5, a program operation of a selected page may include a process of applying a program voltage and a process of performing a program verify operation. These processes may be repeated by gradually increasing a program voltage Vpgm until threshold voltages of all memory cells are increased to a target voltage. This method is referred to as an Incremental Step Pulse Program (ISPP) scheme. In other words, the program voltage applying process and the program verify operation performing process may constitute a single program loop PL. In a program operation using the ISPP scheme, a plurality of program loops PL may be performed by gradually increasing a program voltage.

In a program operation corresponding to an MLC method or a method storing more data bits than the MLC method, a plurality of verify voltages may be used. Therefore, in a program operation using an ISPP method, the program loops PL using a plurality of verify voltages may be performed. For example, in the program loop PL using a first verify voltage Vf1, a verify operation may be performed by increasing threshold voltages of memory cells by applying the program voltage Vpgm to a selected word line Sel.WL, and determining whether the threshold voltages of the memory cells are higher than the first verify voltage Vf1 by applying the first verify voltage Vf1 to selected memory cells. When the threshold voltages of the memory cells are higher than the first verify voltage Vf1, a verify operation using a second verify voltage Vf2 higher than the first verify voltage Vf1 may be performed. In this manner, when a verify operation using a third verify voltage Vf3 passes, the program operation of the selected page may be terminated.

As illustrated in FIG. 5, one verify voltage may be used in one program loop PL. However, a plurality of verify voltages may be used in one program loop PL depending on a program method.

A program verify operation may be performed in a similar method to a read operation. For example, a program verify operation may be performed in such a manner that precharges bit lines and senses a voltage or current in the bit lines that varies depending on threshold voltages of memory cells. In this embodiment, during a program verify operation, bit lines may be selectively precharged according to a verify voltage corresponding to a read voltage.

Figure 6:
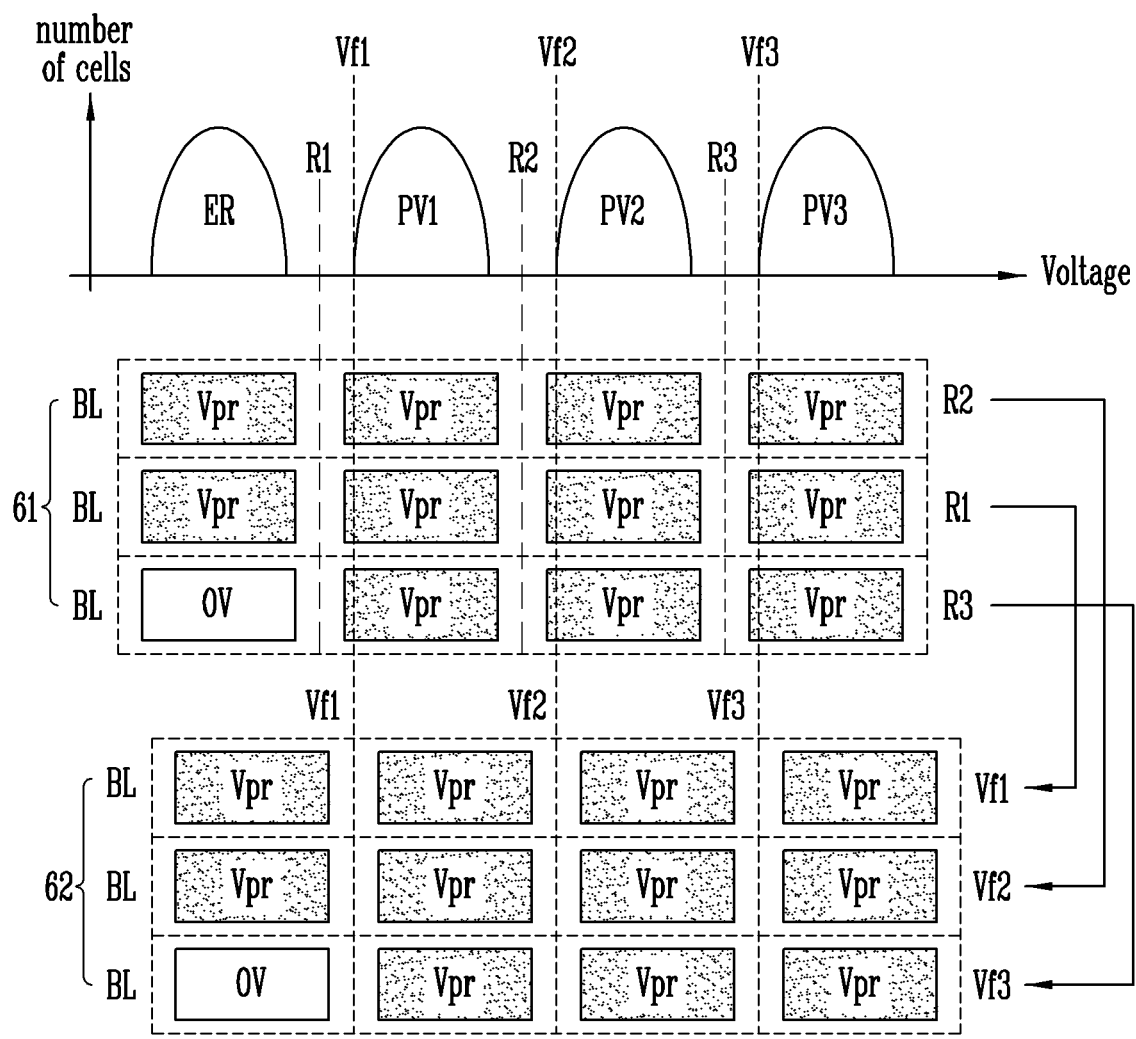
FIG. 6 is a diagram illustrating a bit line precharging method in a program verify operation according to a first embodiment of the present disclosure.

FIG. 6 is a diagram illustrating a bit line precharging method in a program verify operation according to a first embodiment of the present disclosure.

Referring to FIG. 6, in the first embodiment, a program verify operation performed in a program operation using an MLC method is shown. During the program verify operation, bit lines may be selectively precharged according to a verify voltage corresponding to a read voltage. In FIG. 6, reference numeral 61 denotes a method of precharging bit lines during a read operation and reference numeral 62 denotes a method of selectively precharging bit lines during a program verify operation.

Since the method of precharging the bit lines as shown in 61 is the same as the method described with reference to FIG. 4, a detailed description thereof will be omitted.

Referring to reference numeral 62, the first to third verify voltages Vf1 to Vf3 used in the program verify operation may correspond to the first to third read voltages R1 to R3, respectively. The method of precharging the bit lines in the read operations using the first to third read voltages R1 to R3 may be applied to the program verify operation.

For example, the first verify voltage Vf1 may correspond to the first read voltage R1. During the read operation using the first read voltage R1, the precharge voltage Vpr may be applied to all bit lines. Therefore, in a program verify operation using the first verify voltage Vf1, the precharge voltage Vpr may be applied to all bit lines. The second verify voltage Vf2 may correspond to the second read voltage R2. During the read operation using the second read voltage R2, the precharge voltage Vpr may be applied to all bit lines. Therefore, in a program verify operation using the second verify voltage Vf2, the precharge voltage Vpr may be applied to all bit lines. The third verify voltage Vf3 may correspond to the third read voltage R3. In the read operation using the third read voltage R3, a ground voltage of 0 V may be applied to bit lines coupled to memory cells with determined data, and the precharge voltage Vpr may be applied to bit lines coupled to memory cells with no determined data. Accordingly, during the program verify operation, the ground voltage of 0 V may be applied to the bit lines coupled to the memory cells corresponding to the erase state ER, and the precharge voltage Vpr may be applied to the remaining bit lines.

As shown in 62, by selectively precharging the bit lines according to the first to third verify voltages Vf1 to Vf3 during the program verify operation, noise which may occur during the read operations using the first to third read voltages R1 to R3 may be compensated. In other words, during a program verify operation, by precharging bit lines in the same manner as a read operation, noise which may occur in the bit lines caused by erased cells or programmed cells during the read operation may be offset and prevent potential errors caused by noise in the bit lines.

Figure 7:
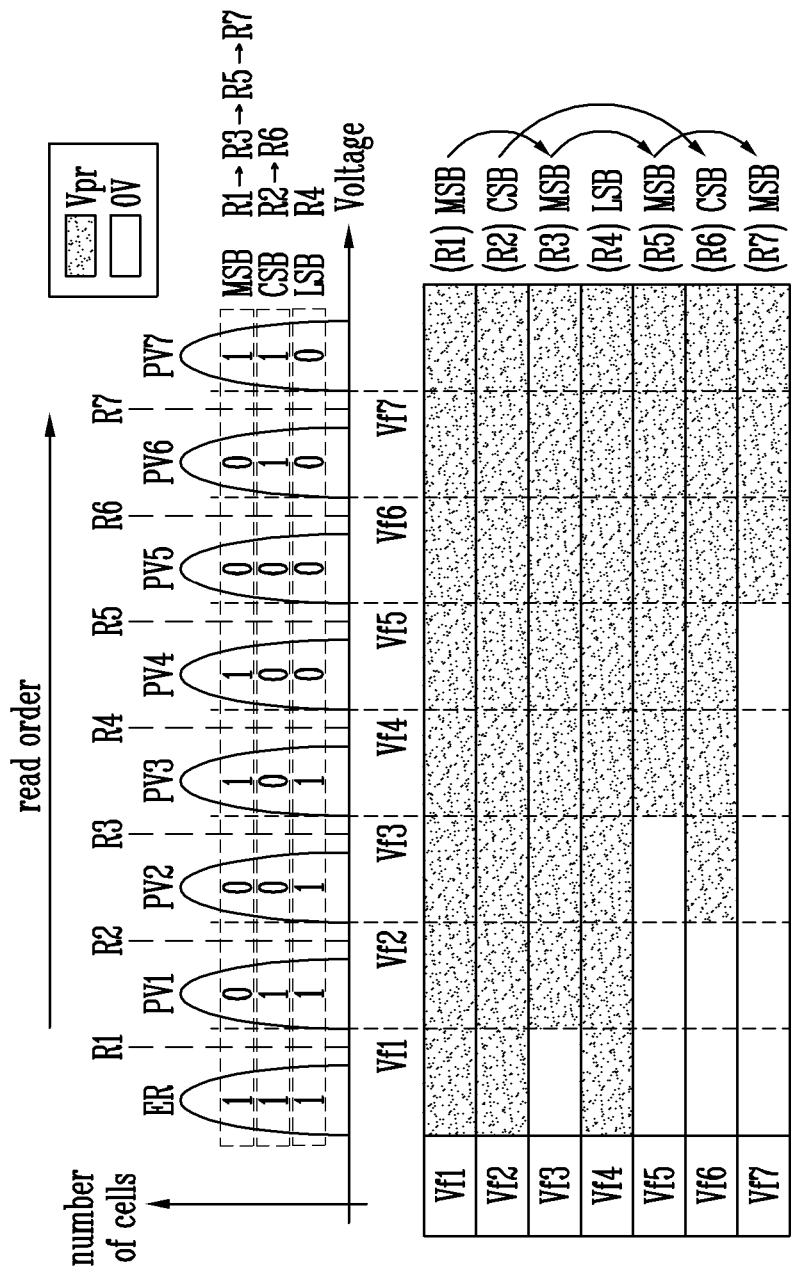
FIG. 7 is a diagram illustrating a bit line precharging method in a program verify operation according to a second embodiment of the present disclosure.

FIG. 7 is a diagram illustrating a bit line precharging method in a program verify operation according to a second embodiment of the present disclosure.

Referring to FIG. 7, according to the second embodiment, in a memory device according to a TLC method where read operations are performed in a first order (read order), a bit line precharging method in a program verify operation is shown.

In the TLC method, three bits of data may be stored in a single memory cell. Memory cells may be programmed into one of the erase state ER and the first to seventh program states PV1 to PV7. The three bits of data may be defined as logical data corresponding to different logical pages. In other words, the three bits of data may consist of LSB data, CSB data and MSB data. For example, when the LSB, CSB and MSB data of the memory cells in the erase state ER are defined as 1, 1, and 1, respectively, a gray code of the erase state ER may be 111. When the LSB, CSB and MSB data of the memory cells in the first program state PV1 are defined as 1, 1, and 0, respectively, a gray code of the first program state PV1 may be 110. In this manner, gray codes of the erase state ER, the first program state PV1, the second program state PV2, the third program state PV3, the fourth program state PV4, the fifth program state PV5, the sixth program state PV6, and the seventh program state PV7 may be sequentially set to 111, 110, 100, 101, 001, 000, 010 and 011. The gray codes shown in FIG. 7 are shown as an exemplary embodiment, however, various other combinations may be set.

In FIG. 7, the order of read voltages shown on the right side of the threshold voltages may refer to the order of read operations, and the drawing of Vf1 to Vf7 as shown below the threshold voltages illustrates a method of selectively precharging bit lines during a program verify operation. In FIG. 7, a program verify operation when read operations of reading logical data are performed in order from a low level to a high level is described as an example.

Referring to FIG. 7, read operations are described below.

In an LSB read operation, only the read operation using a fourth read voltage R4 may be performed. In a CSB read operation, read operations using second and sixth read voltages R2 and R6 may be performed. In an MSB read operation, read operations using first, third, fifth and seventh R1, R3, R5, and R7 may be performed.

In the LSB read operation, since only the read operation using the fourth read voltage R4 is performed, the LSB data of the erase state ER and the first to seventh program states PV1 to PV7 may be determined as 1 or 0. For example, memory cells having threshold voltages less than the fourth read voltage R4 and corresponding to the erase state ER and the first to third program states PV1 to PV3 may be read as a value of 1, and memory cells having threshold voltages greater than the fourth read voltage R4 and corresponding to the fourth to seventh program states PV4 to PV7 may be read as 0. In the LSB read operation, only the read operation using the fourth read voltage R4 may be performed. Therefore, data read during the read operation using the fourth read voltage R4 may be determined data, and the LSB read operation may be terminated.

When the LSB read operation ends, a CSB read operation may be performed.

In the CSB read operation, the read operation using the second read voltage R2 and the read operation using the sixth read voltage R6 may be sequentially performed.

The second read voltage R2 may be the lowest read voltage among the read voltages for identifying the CSB data. Therefore, when the read operation using the second read voltage R2 is performed, '1' data read from memory cells having threshold voltages less than the second read voltage R2 may be determined data. For example, data read from the memory cells corresponding to the erase state ER and the first program state PV1 and having threshold voltages lower than the second read voltage R2 may be determined data.

Since the CSB data is completed by further performing the read operation using the sixth read voltage R6, '0' data read from memory cells having threshold voltages greater than the second read voltage R2 may not be determined data.

When the read operation using the sixth read voltage R6 is performed, a ground voltage (0 V) may be applied to bit lines of columns determined during the read operation using the second read voltage R2, and the precharge voltage Vpr may be applied to only bit lines of columns with no determined data. For example, during the read operation using the sixth read voltage R6, the ground voltage may be applied to the bit lines of the columns corresponding to the memory cells in the erase state ER and the first program state PV1 with the determined data, and the precharge voltage Vpr may be applied to the remaining bit lines.

When the read operation using the sixth read voltage R6 is performed, '1' data may be read from the memory cells having the second to fifth program states PV2 to PV5, and '0' data may be read from the memory cells having the sixth and seventh program states PV6 and PV7. According to an algorithm of a CSB read operation, the data read using the sixth read voltage R6 may be inverted and stored in the page buffers. As a result, data of the memory cells corresponding to the second to fifth program states PV2 to PV5 may be determined as 0, and data of the memory cells corresponding to the sixth and seventh program states PV6 and PV7 may be determined as 1. Since the data of the memory cells corresponding to the erase state ER and the first program state PV1 is determined as 1 during the read operation using the second read voltage R2, the CSB read operation may be terminated when the read operation using the sixth read voltage R6 finishes.

When the CSB read operation ends, an MSB read operation may be performed.

In the MSB read operation, read operations using the first, third, fifth and seventh read voltages R1, R3, R5, and R7 may be sequentially performed.

The first read voltage R1 may be the lowest read voltage among the read voltages for identifying the MSB data. Therefore, when the read operation using the first read voltage R1 is performed, '1' data read from memory cells having threshold voltages less than the first read voltage R1 may be determined data. For example, data read from the memory cells corresponding to the erase state ER and having threshold voltages lower than the first read voltage R1 may be determined data.

Since read operations are to be further performed subsequent to the read operation using the first read voltage R1, the data read from memory cells having the threshold voltages greater than the first read voltage R1 may not be determined data.

When the read operation using the third read voltage R3 is performed, a ground voltage (0 V) may be applied to bit lines of columns determined during the read operation using the first read voltage R1, and the precharge voltage Vpr may be applied to only bit lines of columns with no determined data. For example, during the read operation using the third read voltage R3, the ground voltage may be applied to the bit lines of the columns corresponding to the memory cells in the erase state ER with the determined data, and the precharge voltage Vpr may be applied to the remaining bit lines.

When the read operation using the third read voltage R3 is performed, '1' data may be read from the memory cells having the first and second program states PV1 and PV2, and '0' data may be read from the memory cells having the third to seventh program states PV3 to PV7. According to an algorithm of the MSB read operation, the data read using the third read voltage R3 may be inverted and stored in the page buffers. Therefore, data of the memory cells corresponding to the first and second program states PV1 and PV2 may be determined as 0.

When a read operation using the fifth read voltage R5 is performed, the ground voltage (0 V) may be applied to the bit lines of the columns determined during the read operation using the third read voltage R3, and the precharge voltage Vpr may be applied to only the bit lines of the columns with no determined data. For example, in the read operation using the fifth read voltage R5, the ground voltage (0 V) may be applied to the bit lines of the columns corresponding to the memory cells in the erase state ER and the first and second program states PV1 and PV2 with determined data in the read operations using the first and third read voltages R1 and R3, and the precharge voltage Vpr may be applied to the remaining bit lines. When the read operation using the fifth read voltage R5 is performed, '1' data read from the memory cells corresponding to the third and fourth program states PV3 and PV4 and having threshold voltages less than the fifth read voltage R5 may be determined data.

When a read operation using the seventh read voltage R7 is performed, a ground voltage (0 V) may be applied to bit lines of the columns determined during the read operation using the fifth read voltage R5, and the precharge voltage Vpr may be applied to only bit lines of the columns with no determined data. For example, during the read operation using the seventh read voltage R7, the ground voltage (0 V) may be applied to the bit lines of the columns corresponding to the memory cells having the erase state ER and the first to fourth program states PV1 to PV4 with the determined data in the read operations using the first, third and fifth read voltages R1, R3 and R5, and the precharge voltage Vpr may be applied to the remaining bit lines. When the read operation using the seventh read voltage R7 is performed, '1' data may be read from the memory cells corresponding to the fifth and sixth program states PV5 and PV6 and having threshold voltages less than the seventh read voltage R7, and '0' data may be read from the memory cells having threshold voltages greater than the seventh read voltage R7. According to an algorithm of the MSB read operation, the data read using the seventh read voltage R7 may be inverted and stored in the page buffers. As a result, data of the memory cells corresponding to the fifth and sixth program states PV5 and PV6 may be determined as 0, and data of the memory cells corresponding to the seventh program state PV7 may be determined as 1.

A read operation may be performed on a page including memory cells programmed into one of the erase state ER and the first to seventh program states PV1 to PV7. Therefore, noise may vary depending on the read operations using the first to seventh read voltages R1 to R7. Therefore, in this embodiment, to compensate for noise which may occur in a read operation, a method of selectively precharging bit lines in the read operation may be reflected in a program verify operation.

A program verify operation to which the above-described order of the read operations is applied is described below.

Referring to FIG. 7, the program verify operation is described below.

A program operation may be performed to gradually increase threshold voltages of memory cells in an erase state. Therefore, verify voltages may be used in a sequential manner from a low level during a program verify operation. For example, the first verify voltage Vf1 which is the lowest voltage among the first to seventh verify voltages Vf1 to Vf7 may be used first, the second verify voltage Vf2 may then be used, and subsequently, the third to seventh verify voltages Vf3 to Vf7 may be sequentially used to perform the program verify operation.

The first verify voltage Vf1 may correspond to the first read voltage R1 and the first read voltage R1 may be used first in the MSB read operation. Therefore, during the program verify operation using the first verify voltage Vf1, the precharge voltage Vpr may be applied to all bit lines similar to the read operation using the first read voltage R1. For example, when the program verify operation using the first verify voltage Vf1 starts, the precharge voltage Vpr may be applied to all bit lines, and the first verify voltage Vf1 may be applied to a selected word line, thereby performing the program verify operation.

The second verify voltage Vf2 may correspond to the second read voltage R2 and the second read voltage R2 may be used first in the CSB read operation. Therefore, during the program verify operation using the second verify voltage Vf2, the precharge voltage Vpr may be applied to all bit lines as in the read operation using the second read voltage R2. For example, when the program verify operation using the second verify voltage Vf2 starts, the precharge voltage Vpr may be applied to all bit lines, and the second verify voltage Vf2 may be applied to the selected word line, thereby performing the program verify operation.

The third verify voltage Vf3 may correspond to the third read voltage R3, and the third read voltage R3 may be used after the first read voltage R1 in the MSB read operation. Therefore, during a program verify operation using the third verify voltage Vf3, a ground voltage (0 V) may be applied to bit lines coupled to memory cells corresponding to the erase state ER, and the precharge voltage Vpr may be applied to the remaining bit lines in the same manner as the read operation using the third read voltage R3. For example, when the program verify operation using the third verify voltage Vf3 starts, the ground voltage (0 V) may be applied to the bit lines coupled to the memory cells corresponding to the erase state ER, the precharge voltage Vpr may be applied to the remaining bit lines, and the third verify voltage Vf3 may be applied to the selected word line, thereby performing the program verify operation.

A fourth verify voltage Vf4 may correspond to the fourth read voltage R4 and the fourth read voltage R4 may be used first in the LSB read operation. Therefore, during a program verify operation using the fourth verify voltage Vf4, the precharge voltage Vpr may be applied to all bit lines as in the read operation using the fourth read voltage R4. For example, when the program verify operation using the fourth verify voltage Vf4 starts, the precharge voltage Vpr may be applied to all bit lines, and the fourth verify voltage Vf4 may be applied to the selected word line, thereby performing the program verify operation.

A fifth verify voltage Vf5 may correspond to the fifth read voltage R5 and the fifth read voltage R5 may be used after the third read voltage R3 in the MSB read operation. Therefore, during a program verify operation using the fifth verify voltage Vf5, the ground voltage (0 V) may be applied to bit lines coupled to memory cells corresponding to the erase state ER and the first and second program states PV1 and PV2, and the precharge voltage Vpr may be applied to the remaining bit lines in the same manner as the read operation using the fifth read voltage R5. For example, when the program verify operation using the fifth verify voltage Vf5 starts, the ground voltage (0 V) may be applied to the bit lines coupled to the memory cells corresponding to the erase state ER and the first and second program states PV1 and PV2, the precharge voltage Vpr may be applied to the remaining bit lines, and the fifth verify voltage Vf5 may be applied to the selected word line, thereby performing the program verify operation.

A sixth verify voltage Vf6 may correspond to the sixth read voltage R6, and the sixth read voltage R6 may be used after the second read voltage R2 in the CSB read operation. Therefore, during a program verify operation using the sixth verify voltage Vf6, the ground voltage (0 V) may be applied to bit lines coupled to memory cells corresponding to the erase state ER and the first program state PV1, and the precharge voltage Vpr may be applied to the remaining bit lines in the same manner as the read operation using the sixth read voltage R6. For example, when the program verify operation using the sixth verify voltage Vf6 starts, the ground voltage (0 V) may be applied to the bit lines coupled to the memory cells corresponding to the erase state ER and the first program state PV1, the precharge voltage Vpr may be applied to the remaining bit lines, and the sixth verify voltage Vf6 may be applied to the selected word line, thereby performing the program verify operation.

The seventh verify voltage Vf7 may correspond to the seventh read voltage R7, and the seventh read voltage R7 may be used after the fifth read voltage R5 in the MSB read operation. Therefore, during a program verify operation using the seventh verify voltage Vf7, the ground voltage (0 V) may be applied to bit lines coupled to memory cells corresponding to the erase state ER and the first to fourth program states PV1 to PV4, and the precharge voltage Vpr may be applied to the remaining bit lines in the same manner as the read operation using the seventh read voltage R7. For example, when the program verify operation using the seventh verify voltage Vf7 starts, the ground voltage (0 V) may be applied to the bit lines coupled to the memory cells corresponding to the erase state ER and the first to fourth program states PV1 to PV4, the precharge voltage Vpr may be applied to the remaining bit lines, and the seventh verify voltage Vf7 may be applied to the selected word line, thereby performing the program verify operation.

As described above, by applying a method of selectively precharging bit lines equally to a read operation and a program verify operation, errors caused by noise which may occur in the read operation may be prevented and allow more accurate data storage.

Figure 8:
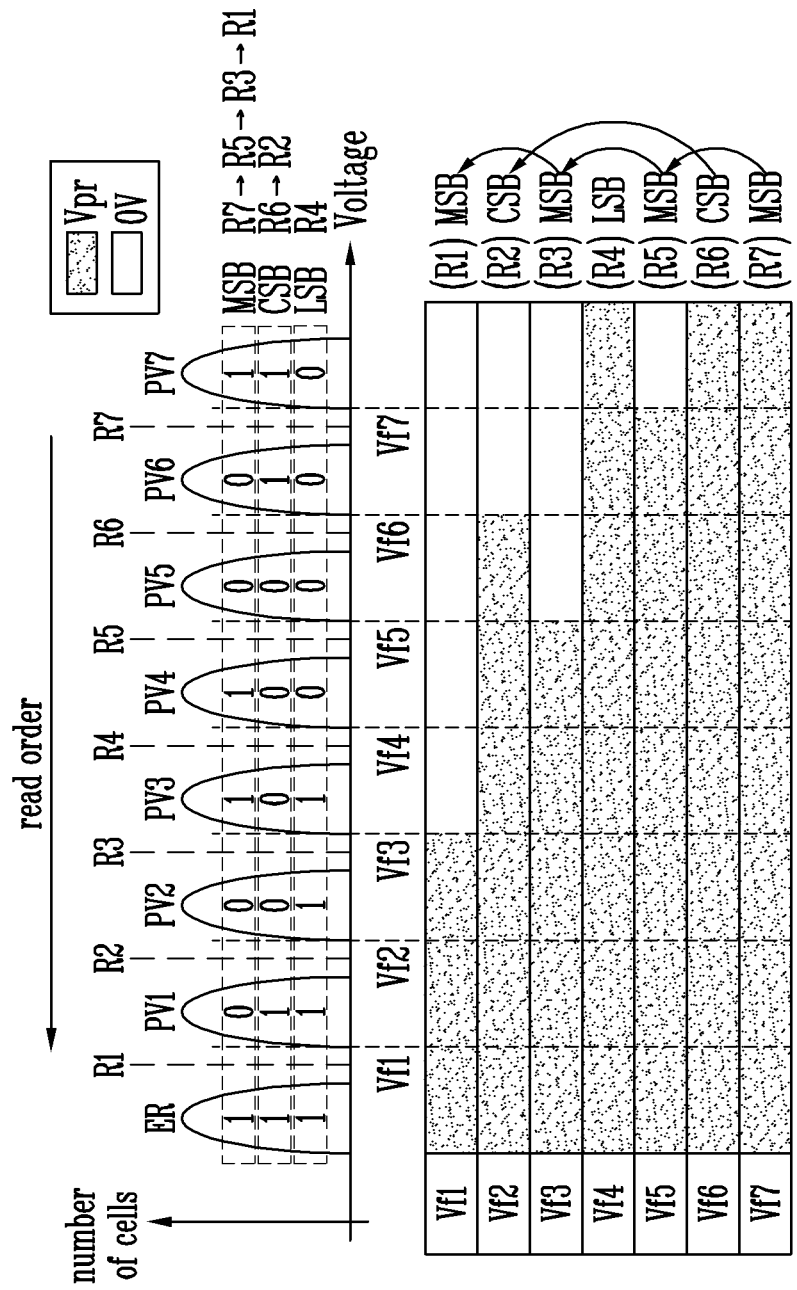
FIG. 8 is a diagram illustrating a bit line precharging method in a program verify operation according to a third embodiment of the present disclosure.

FIG. 8 is a diagram illustrating a bit line precharging method in a program verify operation according to a third embodiment of the present disclosure.

Referring to FIG. 8, according to the third embodiment, in a memory device according to a TLC method where read operations are performed in a second order (read order), a bit line precharging method in a program verify operation is shown. In FIG. 8, overlapping contents with FIG. 7 will be omitted.

In FIG. 8, the order of the read voltages shown on the right side of threshold voltages may refer to the order of read operations, and the drawing of Vf1 to Vf7 as shown below the threshold voltages illustrates a method of selectively precharging bit lines during a program verify operation. In FIG. 8, a program verify operation when read operations of reading logical data are performed in order from a high level to a low level is described as an example.

Referring to FIG. 8, read operations are described below.

In an LSB read operation, only the read operation using the fourth read voltage R4 may be performed. In a CSB read operation, read operations using the sixth and second read voltages R6 and R2 may be performed. In an MSB read operation, read operations using the seventh, fifth, third and first read voltages R7, R5, R3, and R1 may be performed.

In the LSB read operation, since only the read operation using the fourth read voltage R4 is performed, the LSB data of the erase state ER and the first to seventh program states PV1 to PV7 may be determined as 1 or 0. For example, memory cells having threshold voltages less than the fourth read voltage R4 and corresponding to the erase state ER and the first to third program states PV1 to PV3 may be read as a value of 1, and memory cells having threshold voltages greater than the fourth read voltage R4 and corresponding to the fourth to seventh program states PV4 to PV7 may be read as a value of 0. In the LSB read operation, only the read operation using the fourth read voltage R4 may be performed. Therefore, data read during the read operation using the fourth read voltage R4 may be determined data, and the LSB read operation may be terminated.

When the LSB read operation ends, a CSB read operation may be performed.

In the CSB read operation, the read operation using the sixth read voltage R6 and the read operation using the second read voltage R2 may be sequentially performed.

When the read operation using the sixth read voltage R6 is performed, '1' data may be read from the memory cells corresponding to the erase state ER and the first to fifth program states PV1 to PV5 and having threshold voltages less than the sixth read voltage R6, and '0' data may be read from the memory cells having threshold voltages greater than the sixth read voltage R6 and corresponding to the sixth and seventh program states PV6 and PV7. According to an algorithm of the CSB read operation, the data read using the sixth read voltage R6 may be inverted and stored in the page buffers. Therefore, '1' data corresponding to the read data of the memory cells corresponding to the sixth and seventh program states PV6 and PV7 may be determined data.

When the read operation using the second read voltage R2 is performed, the ground voltage (0 V) may be applied to bit lines of the columns determined during the read operation using the sixth read voltage R6, and the precharge voltage Vpr may be applied to only bit lines of the columns with no determined data. For example, the ground voltage of 0 V may be applied to the bit lines of the columns corresponding to memory cells having the sixth and seventh program states PV6 and PV7, and the precharge voltage Vpr may be applied to the remaining bit lines.

When the read operation using the second read voltage R2 is performed, '1' data may be read from the memory cells having the erase state ER and the first program state PV1, and '0' data may be read from the memory cells having the second to fifth program states PV2 to PV5. Since the read operation using the second read voltage R2 is performed last in the CSB read operation, the data read during the read operation using the second read voltage R2 may be determined data. In other words, the CSB data of the memory cells corresponding to the erase state ER and the first program state PV1 may be 1, the CSB data of the memory cells corresponding to the second to fifth program states PV2 to PV5 may be 0, and the CSB data of the memory cells corresponding to the sixth and seventh program states PV6 and PV7 may be 1. When the read operation using the second read voltage R2 is completed, the CSB read operation may be terminated.

When the CSB read operation ends, an MSB read operation may be performed.

In the MSB read operation, the read operations using the seventh, fifth, third and first read voltages R7, R5, R3, and R1 may be sequentially performed.

When the read operation using the seventh read voltage R7 is performed, '1' data may be read from the memory cells corresponding to the erase state ER and the first to sixth program states PV1 to PV6, and having threshold voltages less than the seventh read voltage R7, and '0' data may be read from the memory cells having threshold voltages greater than the seventh read voltage R7 and corresponding to the seventh program state PV7. According to an algorithm of the MSB read operation, the data read using the seventh read voltage R7 may be inverted and stored in the page buffers. As a result, the data of the memory cells in the seventh program state PV7 may be determined as 1.

When the read operation using the fifth read voltage R5 is performed, the ground voltage (0 V) may be applied to bit lines of the columns determined during the read operation using the seventh read voltage R7, and the precharge voltage Vpr may be applied to only bit lines of the columns with no determined data. For example, when the read operation using the fifth read voltage R5 is performed, the ground voltage may be applied to the bit lines of the columns corresponding to the memory cells in the seventh program state PV7 with the determined data during the previous read operation, and the precharge voltage Vpr may be applied to the remaining bit lines.

When the read operation using the fifth read voltage R5 is performed, '1' data may be read from the memory cells corresponding to the erase state ER and the first to fourth program states PV1 to PV4 and having threshold voltages less than the fifth read voltage R5, and '0' data may be read from the memory cells having threshold voltages greater than the fifth read voltage R5 and corresponding to the fifth and sixth program states PV5 and PV6. Therefore, data of the memory cells corresponding to the fifth and sixth program states PV5 and PV6 may be determined as 0.

When the read operation using the third read voltage R3 is performed, the ground voltage (0 V) may be applied to bit lines of the columns determined during the read operation using the fifth read voltage R5, and the precharge voltage Vpr may be applied to only bit lines of columns with no determined data. For example, in the read operation using the third read voltage R3, the ground voltage (0 V) may be applied to the bit lines of the columns corresponding to the memory cells in the fifth to seventh program states PV5 to PV7 with the determined data in the read operations using the seventh and fifth read voltages R7 and R5, and the precharge voltage Vpr may be applied to the remaining bit lines. When the read operation using the third read voltage R3 is performed, '1' data may be read from the memory cells corresponding to the erase state ER and the first and second program states PV1 and PV2, and having threshold voltages less than the third read voltage R3, and '0' data may be read from the memory cells having threshold voltages greater than the third read voltage R3 and corresponding to the third and fourth program states PV3 and PV4. According to an algorithm of the MSB read operation, the data read using the third read voltage R3 may be inverted and stored in the page buffers. Therefore, the data of the memory cells corresponding to the third and fourth program states PV3 and PV4 may be determined as 1.

When the read operation using the first read voltage R1 is performed, the ground voltage (0 V) may be applied to bit lines of the columns determined during the read operation using the seventh, fifth and third read voltage R7, R5, and R3, and the precharge voltage Vpr may be applied to only bit lines of the columns with no determined data. For example, in the read operation using the first read voltage R1, the ground voltage (0 V) may be applied to the bit lines of the columns corresponding to the memory cells in the third to seventh program states PV3 to PV7 with the determined data in the read operations using the seventh, fifth and third read voltages R7, R5 and R3, and the precharge voltage Vpr may be applied to the remaining bit lines. When the read operation using the first read voltage R1 is performed, '1' data may be read from the memory cells corresponding to the erase state ER and having threshold voltages less than the first read voltage R1, and '0' data may be read from the memory cells having threshold voltages greater than the first read voltage R1 and corresponding to the first and second program states PV1 and PV2. Since the read operation using the first read voltage R1 is performed last in the MSB read operation, the data read during the read operation using the first read voltage R1 may be determined data. In other words, both the '1' data read from the memory cells in the erase state ER and the '0' data read from the memory cells in the first and second program states PV1 and PV2 may be determined data.

A program verify operation to which the above-described order of the read operations is applied is described below.

Referring to FIG. 8, the program verify operation is described below.

A program operation may be performed to gradually increase threshold voltages of memory cells in an erase state. Therefore, verify voltages may be used in a sequential manner from a low level during a program verify operation. For example, the first verify voltage Vf1 which is the lowest voltage among the first to seventh verify voltages Vf1 to Vf7 may be used first, the second verify voltage Vf2 may then be used, and subsequently, the third to seventh verify voltages Vf3 to Vf7 may be sequentially used to perform the program verify operation.

The first verify voltage Vf1 may correspond to the first read voltage R1 and the first read voltage R1 may be used last in the MSB read operation. Therefore, during a program verify operation using the first verify voltage Vf1, the precharge voltage Vpr may be applied to bit lines coupled to memory cells corresponding to the erase state ER and the first and second program states PV1 and PV2, and the ground voltage (0 V) may be applied to bit lines coupled to the memory cells corresponding to the third to seventh program states PV3 to PV7 in the same manner as the read operation using the first read voltage R1. For example, when the program verify operation using the first verify voltage Vf1 starts, the precharge voltage Vpr may be applied to bit lines coupled to the memory cells corresponding to the erase state ER and the first and second program states PV1 and PV2, the ground voltage (0 V) may be applied to bit lines coupled to the memory cells corresponding to the third to seventh program states PV3 to PV7, and the first verify voltage Vf1 may be applied to a selected word line, thereby performing the program verify operation.

The second verify voltage Vf2 may correspond to the second read voltage R2 and the second read voltage R2 may be used last in the CSB read operation. Therefore, during a program verify operation using the second verify voltage Vf2, the ground voltage (0 V) may be applied to bit lines coupled to memory cells corresponding to the sixth to seventh program states PV6 to PV7, and the precharge voltage Vpr may be applied to the remaining bit lines in the same manner as the read operation using the second read voltage R2. For example, when the program verify operation using the second verify voltage Vf2 starts, the precharge voltage Vpr may be applied to bit lines coupled to the memory cells corresponding to the erase state ER and the first to fifth program states PV1 to PV5, the ground voltage (0 V) may be applied to bit lines coupled to the memory cells corresponding to the sixth and seventh program states PV6 and PV7, and the second verify voltage Vf2 may be applied to the selected word line, thereby performing the program verify operation.

The third verify voltage Vf3 may correspond to the third read voltage R3 and the third read voltage R3 may be used after the fifth read voltage R5 in the MSB read operation. Therefore, during a program verify operation using the third verify voltage Vf3, the ground voltage (0 V) may be applied to bit lines coupled to the memory cells corresponding to the fifth to seventh program states PV5 to PV7, and the precharge voltage Vpr may be applied to the remaining bit lines in the same manner as the read operation using the third read voltage R3. For example, when the program verify operation using the third verify voltage Vf3 starts, the ground voltage (0 V) may be applied to the bit lines coupled to the memory cells corresponding to the fifth to seventh program states PV5 to PV7, the precharge voltage Vpr may be applied to the remaining bit lines, and the third verify voltage Vf3 may be applied to the selected word line, thereby performing the program verify operation.

The fourth verify voltage Vf4 may correspond to the fourth read voltage R4 and the fourth read voltage R4 may be used first in the LSB read operation. Therefore, during a program verify operation using the fourth verify voltage Vf4, the precharge voltage Vpr may be applied to all bit lines as in the read operation using the fourth read voltage R4. For example, when the program verify operation using the fourth verify voltage Vf4 starts, the precharge voltage Vpr may be applied to all bit lines, and the fourth verify voltage Vf4 may be applied to the selected word line, thereby performing the program verify operation.

A fifth verify voltage Vf5 may correspond to the fifth read voltage R5 and the fifth read voltage R5 may be used after the seventh read voltage R7 in the MSB read operation. Therefore, during a program verify operation using the fifth verify voltage Vf5, the ground voltage (0 V) may be applied to bit lines coupled to the memory cells corresponding to the seventh program state PV7 and the precharge voltage Vpr may be applied to the remaining bit lines in the same manner as the read operation using the fifth read voltage R5. For example, when the program verify operation using the fifth verify voltage Vf5 starts, the ground voltage (0 V) may be applied to the bit lines coupled to the memory cells corresponding to the seventh program state PV7, the precharge voltage Vpr may be applied to the remaining bit lines, and the fifth verify voltage Vf5 may be applied to the selected word line, thereby performing the program verify operation.

The sixth verify voltage Vf6 may correspond to the sixth read voltage R6 and the sixth read voltage R6 may be used first in the CSB read operation. Therefore, during a program verify operation using the sixth verify voltage Vf6, the precharge voltage Vpr may be applied to all bit lines as in the read operation using the sixth read voltage R6. For example, when the program verify operation using the sixth verify voltage Vf6 starts, the precharge voltage Vpr may be applied to all bit lines, and the sixth verify voltage Vf6 may be applied to the selected word line, thereby performing the program verify operation.

The seventh verify voltage Vf7 may correspond to the seventh read voltage R7 and the seventh read voltage R7 may be used first in the MSB read operation. Therefore, during a program verify operation using the seventh verify voltage Vf7, the precharge voltage Vpr may be applied to all bit lines as in the read operation using the seventh read voltage R7. For example, when the program verify operation using the seventh verify voltage Vf7 starts, the precharge voltage Vpr may be applied to all bit lines, and the seventh verify voltage Vf7 may be applied to the selected word line, thereby performing the program verify operation.

As described above, by applying a method of selectively precharging bit lines equally to a read operation and a program verify operation, errors caused by noise which may occur in the read operation may be prevented and allow more accurate data storage.

Figure 9:
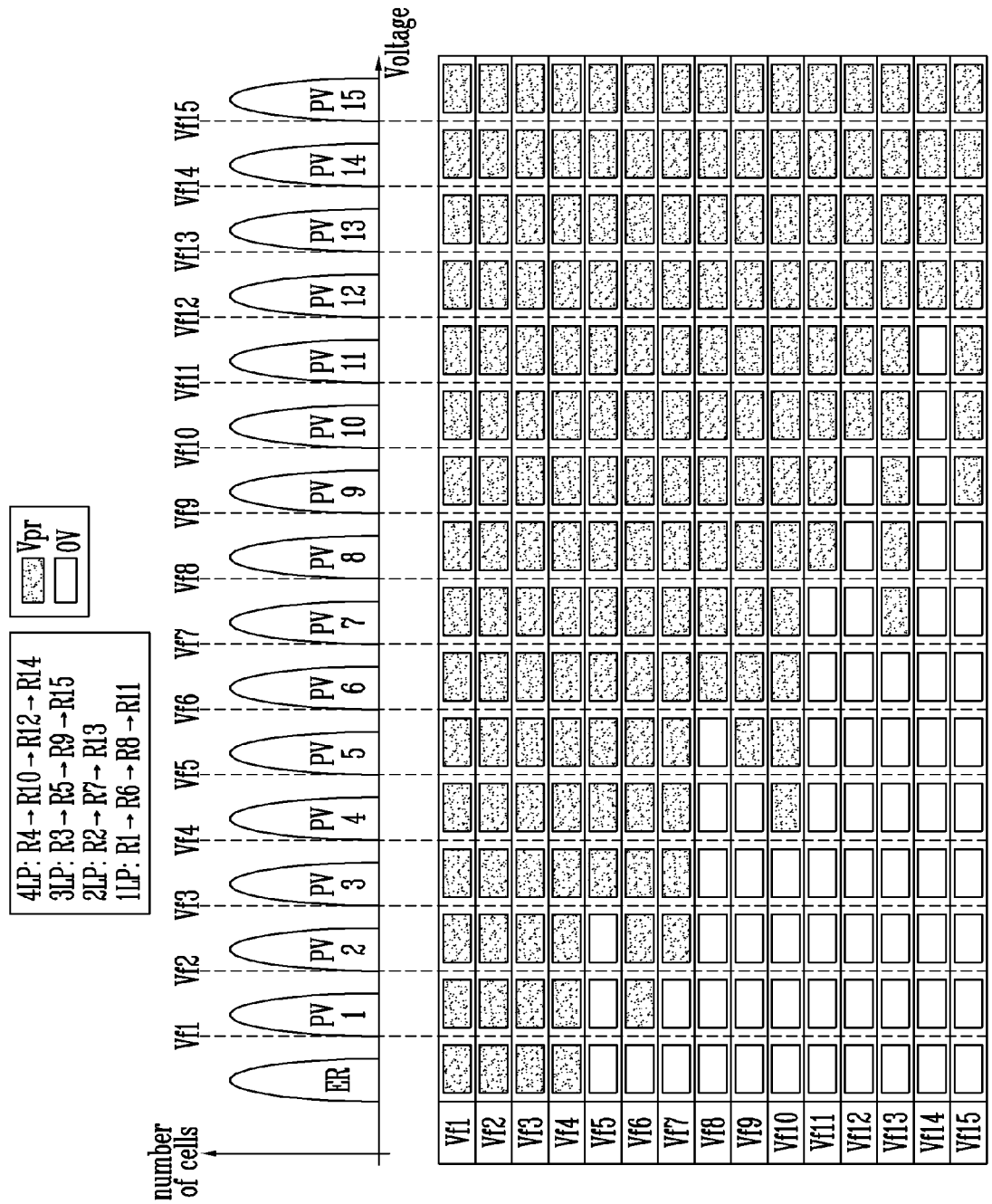
FIG. 9 is a diagram illustrating a bit line precharging method in a program verify operation according to a fourth embodiment of the present disclosure.

FIG. 9 is a diagram illustrating a bit line precharging method in a program verify operation according to a fourth embodiment of the present disclosure.

Referring to FIG. 9, a bit line precharging method in a program verify operation in a memory device using a QLC method is described.

In the QLC method, four bits of data may be stored in a single memory cell. Memory cells may be programmed into one of the erase state ER and the first to $15^{th}$ program states PV1 to PV15. Four bits of data may be defined as logical data corresponding to first to fourth logical pages 1LP to 4LP, respectively. For example, the four bits of data may include first to fourth logical data. As described with FIG. 7 or 8, the first to fourth logical data may be defined as a gray code consisting of various combinations.

In FIG. 9, the order of read voltages shown above threshold voltages may refer to the order of read operations, and the drawing of Vf1 to Vf15 as shown below the threshold voltages illustrates a method of selectively precharging bit lines during a program verify operation. In the QLC method, bit lines may be selectively precharged during a program verify operation according to order of read operations.

As shown in FIG. 9, read operations of the first to fourth logical pages 1LP to 4LP may be sequentially performed using different read voltages as shown below.

Referring to FIG. 9, read operations are described below.

Read operations of the first logical page 1LP may be performed using the first, sixth, eighth and eleventh read voltages R1, R6, R8, and R11 in a sequential manner. The first read voltage R1 may be used first in the read operations of the first logical page 1LP. Therefore, during the read operation using the first read voltage R1, the precharge voltage Vpr may be applied to all bit lines. For example, the read operation may be performed by applying the precharge voltage Vpr to all bit lines and applying the first read voltage R1 to the selected word line. When the read operation using the first read voltage R1 ends, the read operation using the sixth read voltage R6 may be performed. In the read operation using the sixth read voltage R6, the ground voltage (0 V) may be applied to bit lines of the columns corresponding to read data determined in the read operation using the first read voltage R1, and the precharge voltage Vpr may be applied to the remaining bit lines. In the read operation using the eighth read voltage R8, the ground voltage (0 V) may be applied to bit lines of the columns corresponding to the read data determined in the read operations using the first and sixth read voltages R1 and R6, and the precharge voltage Vpr may be applied to the remaining bit lines. In the read operation using the eleventh read voltage R11, the ground voltage (0 V) may be applied to bit lines of the columns corresponding to the read data determined in the read operations using the first, sixth and eighth read voltages R1, R6 and R8, and the precharge voltage Vpr may be applied to the remaining bit lines.

Read operations of the second logical page 2LP may be performed using the second, seventh and thirteenth read voltages R2, R7, and R13 in a sequential manner. The second read voltage R2 may be used first in the read operations of the second logical page 2LP. Therefore, during the read operation using the second read voltage R2, the precharge voltage Vpr may be applied to all bit lines. For example, the read operation may be performed by applying the precharge voltage Vpr to all bit lines and applying the second read voltage R2 to the selected word line. When the read operation using the second read voltage R2 ends, the read operation using the seventh read voltage R7 may be performed. In the read operation using the seventh read voltage R7, the ground voltage (0 V) may be applied to bit lines of the columns corresponding to the read data determined in the read operation using the second read voltage R2, and the precharge voltage Vpr may be applied to the remaining bit lines. In the read operation using the thirteenth read voltage R13, the ground voltage (0 V) may be applied to bit lines of the columns corresponding to the read data determined in the read operations using the second and seventh read voltages R2 and R7, and the precharge voltage Vpr may be applied to the remaining bit lines. In the read operation using the thirteenth read voltage R13, the ground voltage (0 V) may be applied to bit lines of the columns corresponding to the read data determined in the read operations using the second and seventh read voltages R2 and R7, and the precharge voltage Vpr may be applied to the remaining bit lines.

Read operations of the third logical page 3LP may be performed using the third, fifth, ninth and fifteenth read voltages R3, R5, R9, and R15 in a sequential manner. The third read voltage R3 may be used first in the read operations of the third logical page 3LP. Therefore, during the read operation using the third read voltage R3, the precharge voltage Vpr may be applied to all bit lines. For example, the read operation may be performed by applying the precharge voltage Vpr to all bit lines and applying the third read voltage R3 to a selected word line. When the read operation using the third read voltage R3 ends, the read operation using the fifth read voltage R5 may be performed. In the read operation using the fifth read voltage R5, the ground voltage (0 V) may be applied to bit lines of the columns corresponding to the read data determined in the read operation using the third read voltage R3, and the precharge voltage Vpr may be applied to the remaining bit lines. In the read operation using the ninth read voltage R9, the ground voltage (0 V) may be applied to bit lines of the columns corresponding to the read data determined in the read operations using the third read voltage R3 and the fifth read voltage R5, and the precharge voltage Vpr may be applied to the remaining bit lines. In the read operation using the fifteenth read voltage R15, the ground voltage (0 V) may be applied to bit lines of the columns corresponding to the read data determined in the read operations using the third, fifth and ninth read voltages R3, R5 and R9, and the precharge voltage Vpr may be applied to the remaining bit lines.

Read operations of the fourth logical page 4LP may be performed using the fourth, tenth, twelfth and fourteenth $14^{th}$ read voltages R4, R10, R12, and R14 in a sequential manner. The fourth read voltage R4 may be used first in the read operations of the fourth logical page 4LP. Therefore, during the read operation using the fourth read voltage R4, the precharge voltage Vpr may be applied to all bit lines. For example, the read operation may be performed by applying the precharge voltage Vpr to all bit lines and applying the fourth read voltage R4 to the selected word line. When the read operation using the fourth read voltage R4 ends, the read operation using the tenth read voltage R10 may be performed. In the read operation using the tenth read voltage R10, the ground voltage (0 V) may be applied to bit lines of the columns corresponding to the read data determined in the read operation using the fourth read voltage R4, and the precharge voltage Vpr may be applied to the remaining bit lines. In the read operation using the twelfth read voltage R12, the ground voltage (0 V) may be applied to bit lines of the columns corresponding to the read data determined in the read operations using the fourth and tenth read voltages R4 and R10, and the precharge voltage Vpr may be applied to the remaining bit lines. In the read operation using the fourteenth read voltage R14, the ground voltage (0 V) may be applied to bit lines of the columns corresponding to read data determined in the read operations using the fourth, tenth and twelfth read voltages R4, R10 and R12, and the precharge voltage Vpr may be applied to the remaining bit lines.

Referring to FIG. 9, the program verify operation is described below.

A program operation may be performed to gradually increase threshold voltages of memory cells in an erase state. Therefore, verify voltages may be used in a sequential manner from a low level during a program verify operation. For example, the first verify voltage Vf1 which is the lowest voltage among the first to fifteenth verify voltages Vf1 to Vf15 may be used first, the second verify voltage Vf2 may then be used, and subsequently, the third to fifteenth verify voltages Vf3 to Vf15 may be sequentially used to perform the program verify operation.

The first verify voltage Vf1 may correspond to the first read voltage R1 and the first read voltage R1 may be used first in the read operations of the first logical page 1LP. Therefore, during the program verify operation using the first verify voltage Vf1, the precharge voltage Vpr may be applied to all bit lines as in the read operation using the first read voltage R1. For example, when the program verify operation using the first verify voltage Vf1 starts, the precharge voltage Vpr may be applied to all bit lines, and the first verify voltage Vf1 may be applied to the selected word line, thereby performing the program verify operation.

The second verify voltage Vf2 may correspond to the second read voltage R2 and the second read voltage R2 may be used first in the read operations of the second logical page 2LP. Therefore, during the program verify operation using the second verify voltage Vf2, the precharge voltage Vpr may be applied to all bit lines as in the read operation using the second read voltage R2. For example, when the program verify operation using the second verify voltage Vf2 starts, the precharge voltage Vpr may be applied to all bit lines, and the second verify voltage Vf2 may be applied to the selected word line, thereby performing the program verify operation.

The third verify voltage Vf3 may correspond to the third read voltage R3 and the third read voltage R3 may be used first in the read operations of the third logical page 3LP. Therefore, during the program verify operation using the third verify voltage Vf3, the precharge voltage Vpr may be applied to all bit lines as in the read operation using the third read voltage R3. For example, when the program verify operation using the third verify voltage Vf3 starts, the precharge voltage Vpr may be applied to all bit lines, and the third verify voltage Vf3 may be applied to the selected word line, thereby performing the program verify operation.

The fourth verify voltage Vf4 may correspond to the fourth read voltage R4 and the fourth read voltage R4 may be used first in the read operations of the fourth logical page 4LP. Therefore, during a program verify operation using the fourth verify voltage Vf4, the precharge voltage Vpr may be applied to all bit lines as in the read operation using the fourth read voltage R4. For example, when the program verify operation using the fourth verify voltage Vf4 starts, the precharge voltage Vpr may be applied to all bit lines, and the fourth verify voltage Vf4 may be applied to the selected word line, thereby performing the program verify operation.

The fifth verify voltage Vf5 may correspond to the fifth read voltage R5 and the fifth read voltage R5 may be used after the third read voltage R3 in the read operations of the third logical page 3LP. Therefore, during a program verify operation using the fifth verify voltage Vf5, the ground voltage (0 V) may be applied to bit lines coupled to the memory cells corresponding to the erase state ER and the first and second program states PV1 and PV2, and the precharge voltage Vpr may be applied to the remaining bit lines in the same manner as the read operation using the fifth read voltage R5. For example, when the program verify operation using the fifth verify voltage Vf5 starts, the ground voltage (0 V) may be applied to the bit lines coupled to the memory cells corresponding to the erase state ER and the first and second program states PV1 and PV2, the precharge voltage Vpr may be applied to the remaining bit lines, and the fifth verify voltage Vf5 may be applied to the selected word line, thereby performing the program verify operation.

The sixth verify voltage Vf6 may correspond to the sixth read voltage R6 and the sixth read voltage R6 may be used after the first read voltage R1 in the read operations of the first logical page 1LP. Therefore, during a program verify operation using the sixth verify voltage Vf6, the ground voltage (0 V) may be applied to bit lines coupled to the memory cells corresponding to the erase state ER, and the precharge voltage Vpr may be applied to the remaining bit lines in the same manner as the read operation using the sixth read voltage R6. For example, when the program verify operation using the sixth verify voltage Vf6 starts, the ground voltage (0 V) may be applied to the bit lines coupled to the memory cells corresponding to the erase state ER, the precharge voltage Vpr may be applied to the remaining bit lines, and the sixth verify voltage Vf6 may be applied to the selected word line, thereby performing the program verify operation.

The seventh verify voltage Vf7 may correspond to the seventh read voltage R7 and the seventh read voltage R7 may be used after the second read voltage R2 in the read operations of the second logical page 2LP. Therefore, during a program verify operation using the seventh verify voltage Vf7, the ground voltage (0 V) may be applied to bit lines coupled to the memory cells corresponding to the erase state ER and the first program state PV1, and the precharge voltage Vpr may be applied to the remaining bit lines in the same manner as the read operation using the seventh read voltage R7. For example, when the program verify operation using the seventh verify voltage Vf7 starts, the ground voltage (0 V) may be applied to the bit lines coupled to the memory cells corresponding to the erase state ER and the first program state PV1, the remaining bit lines may be applied to the remaining bit lines, and the seventh verify voltage Vf7 may be applied to the selected word line, thereby performing the program verify operation.

The eighth verify voltage Vf8 may correspond to the eighth read voltage R8 and the eighth read voltage R8 may be used after the sixth read voltage R6 in the read operations of the first logical page 1LP. Therefore, during a program verify operation using the eighth verify voltage Vf8, the ground voltage (0 V) may be applied to bit lines coupled to the memory cells corresponding to the erase state ER and the first to fifth program states PV1 to PV5, and the precharge voltage Vpr may be applied to the remaining bit lines in the same manner as the read operation using the eighth read voltage R8. For example, when the program verify operation using the eighth verify voltage Vf8 starts, the ground voltage (0 V) may be applied to the bit lines coupled to the memory cells corresponding to the erase state ER and the first to fifth program states PV1 to PV5, the precharge voltage Vpr may be applied to the remaining bit lines, and the eighth verify voltage Vf8 may be applied to the selected word line, thereby performing the program verify operation.

The ninth verify voltage Vf9 may correspond to the ninth read voltage R9 and the ninth read voltage R9 may be used after the fifth read voltage R5 in the read operations of the third logical page 3LP. Therefore, during a program verify operation using the ninth verify voltage Vf9, the ground voltage (0 V) may be applied to bit lines coupled to the memory cells corresponding to the erase state ER and the first to fourth program states PV1 to PV4, and the precharge voltage Vpr may be applied to the remaining bit lines in the same manner as the read operation using the ninth read voltage R9. For example, when the program verify operation using the ninth verify voltage Vf9 starts, the ground voltage (0 V) may be applied to the bit lines coupled to the memory cells corresponding to the erase state ER and the first to fourth program states PV1 to PV4, the precharge voltage Vpr may be applied to the remaining bit lines, and the ninth verify voltage Vf9 may be applied to the selected word line, thereby performing the program verify operation.

The tenth verify voltage Vf10 may correspond to the tenth read voltage R10 and the tenth read voltage R10 may be used after the fourth read voltage R4 in the read operations of the fourth logical page 4LP. Therefore, during a program verify operation using the tenth verify voltage Vf10, the ground voltage (0 V) may be applied to bit lines coupled to the memory cells corresponding to the erase state ER and the first to third program states PV1 to PV3, and the precharge voltage Vpr may be applied to the remaining bit lines in the same manner as the read operation using the tenth read voltage R10. For example, when the program verify operation using the tenth verify voltage Vf10 starts, the ground voltage (0 V) may be applied to the bit lines coupled to the memory cells corresponding to the erase state ER and the first to third program states PV1 to PV3, the precharge voltage Vpr may be applied to the remaining bit lines, and the tenth verify voltage Vf10 may be applied to the selected word line, thereby performing the program verify operation.

The eleventh verify voltage Vf11 may correspond to the eleventh read voltage R11 and the eleventh read voltage R11 may be used after the eighth read voltage R8 in the read operations of the first logical page 1LP. Therefore, during a program verify operation using the eleventh verify voltage Vf11, the ground voltage (0 V) may be applied to bit lines coupled to the memory cells corresponding to the erase state ER and the first to seventh program states PV1 to PV7, and the precharge voltage Vpr may be applied to the remaining bit lines in the same manner as the read operation using the eleventh read voltage R11. For example, when the program verify operation using the eleventh verify voltage Vf11 starts, the ground voltage (0 V) may be applied to the bit lines coupled to the memory cells corresponding to the erase state ER and the first to seventh program states PV1 to PV7, the precharge voltage Vpr may be applied to the remaining bit lines, and the eleventh verify voltage Vf11 may be applied to the selected word line, thereby performing the program verify operation.

The twelfth verify voltage Vf12 may correspond to the twelfth read voltage R12 and the twelfth read voltage R12 may be used after the tenth read voltage R10 in the read operations of the fourth logical page 4LP. Therefore, during a program verify operation using the twelfth verify voltage Vf12, the ground voltage (0 V) may be applied to bit lines coupled to memory cells corresponding to the erase state ER and the first to ninth program states PV1 to PV9, and the precharge voltage Vpr may be applied to the remaining bit lines in the same manner as the read operation using the twelfth read voltage R12. For example, when the program verify operation using the twelfth verify voltage Vf12 starts, the ground voltage (0 V) may be applied to the bit lines coupled to the memory cells corresponding to the erase state ER and the first to ninth program states PV1 to PV9, the precharge voltage Vpr may be applied to the remaining bit lines, and the twelfth verify voltage Vf12 may be applied to the selected word line, thereby performing the program verify operation.

The thirteenth verify voltage Vf13 may correspond to the thirteenth read voltage R13 and the thirteenth read voltage R13 may be used after the seventh read voltage R7 in the read operations of the second logical page 2LP. Therefore, during a program verify operation using the thirteenth verify voltage Vf13, the ground voltage (0 V) may be applied to bit lines coupled to the memory cells corresponding to the erase state ER and the first to sixth program states PV1 to PV6, and the precharge voltage Vpr may be applied to the remaining bit lines in the same manner as the read operation using the thirteenth read voltage R13. For example, when the program verify operation using the thirteenth verify voltage Vf13 starts, the ground voltage (0 V) may be applied to the bit lines coupled to the memory cells corresponding to the erase state ER and the first to sixth program states PV1 to PV6, the precharge voltage Vpr may be applied to the remaining bit lines, and the thirteenth verify voltage Vf13 may be applied to the selected word line, thereby performing the program verify operation.

A fourteenth verify voltage Vf14 may correspond to the fourteenth read voltage R14 and the fourteenth read voltage R14 may be used after the twelfth read voltage R12 in the read operations of the fourth logical page 4LP. Therefore, during a program verify operation using the fourteenth verify voltage Vf14, the ground voltage (0 V) may be applied to bit lines coupled to the memory cells corresponding to the erase state ER and the first to eleventh program states PV1 to PV11, and the precharge voltage Vpr may be applied to the remaining bit lines in the same manner as the read operation using the fourteenth read voltage R14. For example, when the program verify operation using the fourteenth verify voltage Vf14 starts, the ground voltage (0 V) may be applied to the bit lines coupled to the memory cells corresponding to the erase state ER and the first to eleventh program states PV1 to PV11, the precharge voltage Vpr may be applied to the remaining bit lines, and the fourteenth verify voltage Vf14 may be applied to the selected word line, thereby performing the program verify operation.

The fifteenth verify voltage Vf15 may correspond to the fifteenth read voltage R15 and the fifteenth read voltage R15 may be used after the ninth read voltage R9 in the read operations of the third logical page 3LP. Therefore, during a program verify operation using the fifteenth verify voltage Vf15, the ground voltage (0 V) may be applied to bit lines coupled to memory cells corresponding to the erase state ER and the first to eighth program states PV1 to PV8, and the precharge voltage Vpr may be applied to the remaining bit lines in the same manner as the read operation using the fifteenth read voltage R15. For example, when the program verify operation using the fifteenth verify voltage Vf15 starts, the ground voltage (0 V) may be applied to the bit lines coupled to the memory cells corresponding to the erase state ER and the first to eighth program states PV1 to PV8, the precharge voltage Vpr may be applied to the remaining bit lines, and the fifteenth verify voltage Vf15 may be applied to the selected word line, thereby performing the program verify operation.

As described above, according to data read during a read operation using a selected read voltage, when a precharge voltage is selectively applied to bit lines during a read operation using a next read voltage, the precharge voltage may be selectively applied to bit lines in a program verify operation according to a verify voltage as in the read operation. Therefore, noise that may occur in the read operation may be reduced by reflecting the noise occurring in the read operation in the program verify operation in advance.

Figure 10:
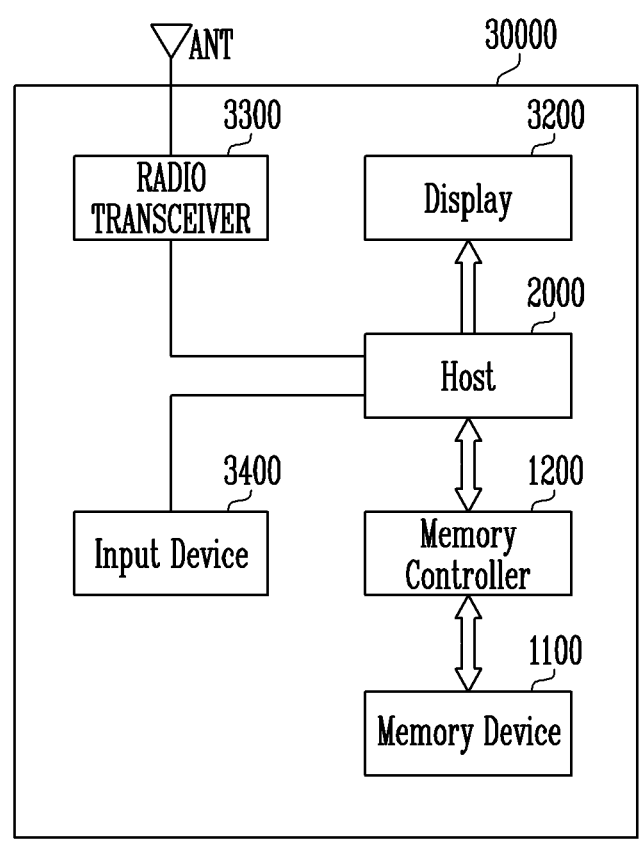
FIG. 10 is a diagram illustrating another embodiment of a memory system including a memory device shown in FIG. 2.

FIG. 10 is a diagram illustrating another embodiment of the memory system 1000 including the memory device 1100 shown in FIG. 2.

Referring to FIG. 10, a memory system 30000 may be embodied in a cellular phone, a smart phone, a tablet PC, a personal digital assistant (PDA), or a wireless communication device.

The memory system 30000 may include the memory device 1100 and the memory controller 1200 for controlling the operations of the memory device 1100. The memory controller 1200 may control a data access operation of the memory device 1100, for example, a program operation, an erase operation or a read operation of the memory device 1100 in response to control of the host 2000.

The memory device 1100 may reduce errors that may occur in a read operation by previously reflecting noise that may occur in the read operation in a program verify operation during a program operation.

The memory controller 1200 may control data programmed into the memory device 1100 to be output through a display 3200 in response to control of the memory controller 1200.

A radio transceiver 3300 may exchange a radio signal through an antenna ANT. For example, the radio transceiver 3300 may change the radio signal received through the antenna ANT into a signal which can be processed by the host 2000. Therefore, the host 2000 may process the signal output from the radio transceiver 3300 and transfer the processed signal to the memory controller 1200 or the display 3200. The memory controller 1200 may transfer the signal processed by the host 2000 into the semiconductor memory device 1100. In addition, the radio transceiver 3300 may change a signal output from the host 2000 into a radio signal and output the radio signal to an external device through the antenna ANT. A control signal for controlling the operations of the host or data to be processed by the host 2000 may be input by an input device 3400, and the input device 3400 may include a pointing device, such as a touch pad, a computer mouse, a keypad, or a keyboard. The host 2000 may control the operations of the display 3200 so that data output from the memory controller 1200, data output from the radio transceiver 3300, or data output from an input device 3400 may be output through the display 3200.

Figure 11:
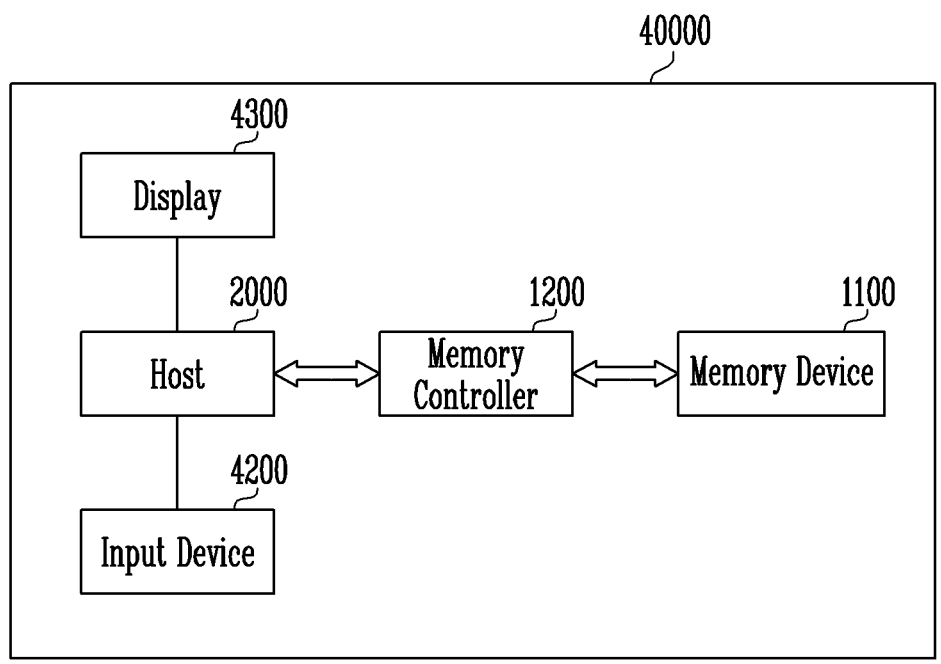
FIG. 11 is a diagram illustrating another embodiment of a memory system including a memory device shown in FIG. 2.

FIG. 11 is a diagram illustrating another embodiment of the memory system 1000 including the memory device 1100 shown in FIG. 2.

Referring to FIG. 11, a memory system 40000 may be embodied in a personal computer (PC), a tablet PC, a net-book, an e-reader, a personal digital assistant (PDA), a portable multimedia player (PMP), an MP3 player, or an MP4 player.

The memory system 40000 may include the memory device 1100 and the memory controller 1200 for controlling a data processing operation of the memory device 1100.

The memory device 1100 may reduce errors that may occur in a read operation by previously reflecting noise that may occur in the read operation in a program verify operation during a program operation.

The host 2000 may output data stored in the memory device 1100 through a display 4300 according to data input through an input device 4200. Examples of the input device 4200 may include a pointing device such as a touch pad, a computer mouse, a keypad, or a keyboard.

The host 2000 may control various operations of the memory system 40000 and control operations of the memory controller 1200.

Figure 12:
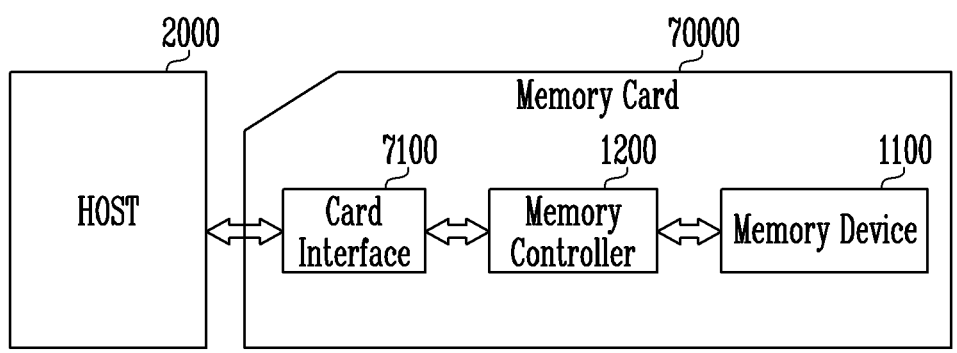
FIG. 12 is a diagram illustrating another embodiment of a memory system including a memory device shown in FIG. 2.

FIG. 12 is a diagram illustrating another embodiment of the memory system 1000 including the memory device 1100 shown in FIG. 2.

Referring to FIG. 12, a memory system may include the host 2000 and a memory card 70000.

The memory card 70000 may be embodied in a smart card. The memory card 70000 may include the memory device 1100, the memory controller 1200 and a card interface 7100.

The memory device 1100 may reduce errors that may occur in a read operation by previously reflecting noise that may occur in the read operation in a program verify operation during a program operation.

The memory controller 1200 may control data exchange between the memory device 1100 and the card interface 7100. According to an embodiment, the card interface 7100 may be, but is not limited to, a secure digital (SD) card interface or a multi-media card (MMC) interface. In addition, the card interface 7100 may interface data exchange between the host 2000 and the memory controller 1200 according to a protocol of the host 2000. According to an embodiment, the card interface 7100 may support a Universal Serial Bus (USB) protocol and an InterChip (IC)-USB protocol. The card interface 7100 may refer to hardware that supports a protocol used by the host 2000, software mounted on the hardware, or a signal transmission method.

In accordance with various embodiments of the invention, a read error caused by noise occurring during a read operation may be prevented by compensating for the noise in a program verify operation. As a result, the reliability of a read operation of a memory device may be improved.

In the above-discussed embodiments, all steps may be selectively performed or skipped. In addition, the steps in each embodiment may not always be performed in regular order. Furthermore, the embodiments disclosed in the present specification and the drawings aim to help those with ordinary knowledge in this art to more clearly understand the present disclosure rather than aiming to limit the bounds of the present disclosure. In other words, one of ordinary skill in the art to which the present disclosure pertains will be able to easily understand that various modifications are possible based on the technical scope of the present disclosure. It will be apparent to those skilled in the art that various modifications can be made to the above-described exemplary embodiments of the present disclosure without departing from the spirit or scope of the invention. Thus, it is intended that the present disclosure cover all such modifications provided they come within the scope of the appended claims and their equivalents.

What is claimed is:

1. A memory device, comprising:
   bit lines coupled to memory cells storing data which is composed of a plurality of logical pages;
   a voltage generator generating read voltages during read operations according to an order of the read operations, or generating verify voltages corresponding to the read voltages during a program verify operation;
   a page buffer controller determining bit lines to apply a precharge voltage or a ground voltage according to the verify voltages and the read voltages for a selected logical page among the plurality of logical pages, and outputting page buffer signals according to determination of the bit lines; and
   a page buffer group applying the precharge voltage or the ground voltage to the bit lines in response to the page buffer signals when the program verify operation is performed,
   wherein the page buffer group is configured to:
   when a first verify operation using a first verify voltage corresponding to a first read voltage of the selected logical page is performed, apply the precharge voltage to the bit lines coupled to all of the memory cells, wherein the first read voltage is a lowest read voltage among the read voltages used for the selected logical page; and
   when a second verify operation using a second verify voltage corresponding to a second read voltage of the selected logical page is performed, apply the ground voltage to bit lines coupled to memory cells corresponding to a threshold voltage lower than the first read voltage, and apply the precharge voltage to remaining bit lines.

2. The memory device of claim 1, wherein the plurality of logical pages include logical data composed of first logical data, second logical data and third logical data.

3. The memory device of claim 2, wherein the selected logical page is one of the first logical data, the second logical data and the third logical data.

4. A method of operating a memory device, the method comprising:
   determining bit lines to apply a precharge voltage or a ground voltage according to verify voltages and read voltages for a selected logical page among a plurality of logical pages;
   applying the precharge voltage to the bit lines coupled to all of memory cells, when a first verify operation using a first verify voltage corresponding to a first read voltage of the selected logical page is performed; and
   applying the ground voltage to bit lines coupled to memory cells corresponding to a threshold voltage lower than the first read voltage, and applying the precharge voltage to remaining bit lines, when a second verify operation using a second verify voltage corresponding to a second read voltage of the selected logical page is performed.

5. The method of claim 4, wherein the plurality of logical pages include logical data composed of first logical data, second logical data and third logical data.

6. The method of claim 5, wherein the selected logical page is one of the first logical data, the second logical data and the third logical data.

* * * * *